US012618903B2

(12) United States Patent
Guo et al.

(10) Patent No.: US 12,618,903 B2
(45) Date of Patent: May 5, 2026

(54) SYSTEM AND METHODS FOR MEASURING ARC DURATION

(71) Applicant: Georgia Tech Research Corporation, Atlanta, GA (US)

(72) Inventors: Ning Guo, Atlanta, GA (US); Abdul Raheem Beyah, Atlanta, GA (US); Morris Cohen, Atlanta, GA (US); Lukas Graber, Atlanta, GA (US); Roderick Gray, Atlanta, GA (US); Samuel Neall, Atlanta, GA (US); Kevin Whitmore, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 193 days.

(21) Appl. No.: 18/649,510

(22) Filed: Apr. 29, 2024

(65) Prior Publication Data

US 2024/0361387 A1    Oct. 31, 2024

Related U.S. Application Data

(60) Provisional application No. 63/499,062, filed on Apr. 28, 2023.

(51) Int. Cl.
*G01R 31/327*       (2006.01)
*G01R 35/00*        (2006.01)

(52) U.S. Cl.
CPC ..... *G01R 31/3274* (2013.01); *G01R 31/3275* (2013.01); *G01R 35/005* (2013.01)

(58) Field of Classification Search
CPC ............ G01R 31/3274; G01R 31/3275; G01R 35/005; G01R 31/1209

(Continued)

(56) References Cited

U.S. PATENT DOCUMENTS 6,191,589 B1 *  2/2001  Clunn .................... H02H 3/334
                                              324/424
6,313,642 B1 * 11/2001  Brooks ................ H02H 1/0015
                                              324/133

(Continued)

FOREIGN PATENT DOCUMENTS

WO        2023147198        8/2023

OTHER PUBLICATIONS

International Search Report and Written Opinion received in PCT/ US2023/012051 mailed Apr. 27, 2023.

(Continued)

*Primary Examiner* — Christopher P Mcandrew
(74) *Attorney, Agent, or Firm* — Meunier Carlin & Curfman LLC

(57)            ABSTRACT

An example method of estimating an arc duration in a circuit breaker includes receiving a first measurement corresponding to a low-frequency electric field emitted from a vacuum circuit breaker during an interruption or circuit break operation and a second measurement corresponding to a low-frequency magnetic field, vibration, or acoustic emitted by the vacuum circuit breaker during operation, aligning the first measurement and the second measurement in time, wherein the first measurement is calibrated according to a first physical constant and wherein the second measurement is calibrated according to a second physical constant; and determining, by a sensor-fusion algorithm or a trained AI model, an estimated duration value of an arc duration using the time-aligned first measurement and second measurement, wherein the arc duration corresponds to a first time corresponding to a separation of contacts of the vacuum circuit breaker and a second time corresponding to arc extinction.

20 Claims, 6 Drawing Sheets

(58) Field of Classification Search
USPC .......................................................... 324/424
See application file for complete search history.

(56) References Cited

U.S. PATENT DOCUMENTS

| | | | | |
|---|---|---|---|---|
| 6,452,767 | B1* | 9/2002 | Brooks | H01R 4/363 |
| | | | | 361/42 |
| 6,538,862 | B1* | 3/2003 | Mason, Jr. | H02H 3/335 |
| | | | | 361/42 |
| 6,545,479 | B1* | 4/2003 | Dollar, II | G01R 31/3274 |
| | | | | 324/424 |
| 7,253,640 | B2* | 8/2007 | Engel | H02H 3/0015 |
| | | | | 324/622 |
| 7,995,314 | B2* | 8/2011 | Titus | H02H 3/04 |
| | | | | 361/42 |
| 2002/0075613 | A1* | 6/2002 | Mason, Jr. | H02H 1/0015 |
| | | | | 307/103 |
| 2003/0205460 | A1* | 11/2003 | Buda | H01J 37/32935 |
| | | | | 204/192.12 |
| 2010/0060469 | A1* | 3/2010 | Hetzmannseder | |
| | | | | G01R 31/3272 |
| | | | | 340/639 |
| 2010/0187916 | A1 | 7/2010 | Saito | |
| 2013/0229173 | A1 | 9/2013 | Bertrand | |
| 2017/0131356 | A1 | 5/2017 | Boury | |
| 2018/0128867 | A1* | 5/2018 | Zhang | H02H 3/335 |
| 2018/0313875 | A1* | 11/2018 | Khozikov | G01R 31/1272 |
| 2019/0098725 | A1* | 3/2019 | Sadwick | H05B 45/20 |
| 2019/0237961 | A1* | 8/2019 | Jiao | G01R 31/52 |
| 2023/0019486 | A1* | 1/2023 | Zlatanski | H01H 71/04 |

OTHER PUBLICATIONS

B. Feizifar and O. Usta, "Condition monitoring of circuit breakers: Current status and future trends," in 2017 IEEE International Conference on Environment and Electrical Engineering and 2017 IEEE Industrial and Commercial Power Systems Europe (EEEIC/I&CPS Europe), pp. 15, IEEE, 2017.

A. A. Razi-Kazemi and K. Niayesh, "Condition monitoring of high voltage circuit breakers: past to future," IEEE Transactions on Power Delivery, vol. 36, No. 2, pp. 740-750, 2020.

T. Cheng, W. Gao, W. Liu, and R. Li, "Evaluation method of contact erosion for high voltage sf6 circuit breakers using dynamic contact resistance measurement," Electric Power Systems Research, vol. 163, pp. 725-732, 2018.

M. Abdollah and A. A. Razi-Kazemi, "Intelligent failure diagnosis for gas circuit breakers based on dynamic resistance measurements," IEEE Transactions on Instrumentation and Measurement, vol. 68, No. 9, pp. 3066-3077, 2018.

G. Chen, M. Li, Q. Wang, X. Lu, S. Zhang, and D. Luo, "The contact erosion characteristics of sf6 circuit breaker based on dynamic resistance measurement method," Energy Reports, vol. 8, pp. 1081-1089, 2022.

H. F. dos Santos Sousa, A. Costa de Oliveira, G. V. Rocha Xavier, H. Nunes de Santana, E. G. da Costa, and T. Vilela Ferreira, "Analysis of alternative parameters of dynamic resistance measurement in high voltage circuit breakers," High Voltage, vol. 4, No. 3, pp. 197-202, 2019.

M. Mohammadhosein, K. Niayesh, A. A. S. Akmal, and H. Mohseni, "Sensitivity of dynamic resistance of gas circuit breakers to the arcinduced contact erosion," in 2019 5th International Conference on Electric Power Equipment-Switching Technology (ICEPE-ST), pp. 3437, IEEE, 2019.

T. Takagi and H. Inoue, "Distribution of arc duration and material wear due to arc for ag, cu, and pd contacts," IEEE Transactions on Components, Hybrids, and Manufacturing Technology, vol. 2, No. 1, pp. 20-24,1979.

H. Sone and T. Takagi, "Role of the metallic phase arc discharge on arc erosion in ag contacts," IEEE transactions on components, hybrids, and manufacturing technology, vol. 13, No. 1, pp. 13-19, 1990.

J. Tepper, M. Seeger, T. Votteler, V. Behrens, and T. Honig, "Investigation on erosion of cu/w contacts in high-voltage circuit breakers," IEEE transactions on components and packaging technologies, vol. 29, No. 3, pp. 658-665, 2006.

S. Zhu, Y. Liu, B. Tian, Y. Zhang, and K. Song, "Arc erosion behavior and mechanism of cu/cr20 electrical contact material," Vacuum, vol. 143, pp. 129-137, 2017.

M. Mohammadhosein, K. Niayesh, A. A. Shayegani-Akmal, and H. Mohseni, "Online assessment of contact erosion in high voltage gas circuit breakers based on different physical quantities," IEEE Transactions on Power Delivery, vol. 34, No. 2, pp. 580-587, 2018.

M. Takashima, N. Yamamura, M. Hasegawa, Y. Watanae, and K. Sawa, "Investigations on mass change and surface morphology of contacts in electromagnetic contactor," in the Forty-Ninth IEEE Holm Conference on Electrical Contacts., pp. 84-90, IEEE, 2003.

K. Sawa, K. Yoshida, M. Watanabe, and K. Suzuki, "Arc characteristics and electrode mass change of agni contacts for electromagnetic contactors," in 2010 Proceedings of the 56th IEEE Holm Conference on Electrical Contacts, pp. 1-6, IEEE, 2010.

A. Bagherpoor, S. Rahimi-Pordanjani, A. A. Razi-Kazemi, and K. Niayesh, "Online condition assessment of interruption chamber of gas circuit breakers using arc voltage measurement," IEEE Transactions on Power Delivery, vol. 32, No. 4, pp. 1776-1783, 2016.

J. J. Shea, "Modeling contact erosion in three phase vacuum contactors," IEEE Transactions on Components, Packaging, and Manufacturing Technology: Part A, vol. 21, No. 4, pp. 556-564, 1998.

M. A. K. Pramanik, T. Takagi, and K. Mano, "A new method for the measurement and integration of arc durations in electrical contacts," IEEE Transactions on Instrumentation and Measurement, vol. 24, No. 2, pp. 188-193, 1975.

Z. Fu, W. Chen, Z. Li, L. Xiang, C. Li, K. Bian, L. Wang, and B. Liu, "Wear mechanism and mass loss characteristic of arcing contacts in sf6 circuit breaker in making process," IEEE Transactions on Components, Packaging and Manufacturing Technology, vol. 8, No. 9, pp. 1593-1603, 2018.

M. A. Chapman, Possibilities and limitations of radio-frequency measurement of arc duration in HVAC circuit breakers. PhD thesis, ETH Zurich, 2011.

T. Sidhu, G. Singh, and M. Sachdev, "Microprocessor based instrument for detecting and locating electric arcs," IEEE transactions on power delivery, vol. 13, No. 4, pp. 1079-1085, 1998.

A. Ukil, M. Zlatanski, and M. Hochlehnert, "Monitoring of hv generator circuit breaker contact ablation based on acoustic emission," IEEE Transactions on Instrumentation and Measurement, vol. 62, No. 10, pp. 2683-2693, 2013.

M. Chapman, "Radio-frequency-based determination of arcing duration in hvac circuit breakers," in CIRED 2005—18th International Conference and Exhibition on Electricity Distribution, pp. 1-5, IET, 2005.

M. Mohammadhosein, K. Niayesh, A. A. Shayegani Akmal, and H. Mohseni, "Online non-invasive evaluation of arcing time for condition assessment of high-voltage gas circuit breakers," IET Generation, Transmission & Distribution, vol. 15, No. 6, pp. 1013-1020, 2021.

J. Fayyad, M. A. Jaradat, D. Gruyer, and H. Najjaran, "Deep learning sensor fusion for autonomous vehicle perception and localization: A review," Sensors, vol. 20, No. 15, p. 4220, 2020.

J. Zhang, Y. Wu, Z. Xu, Z. Din, and H. Chen, "Fault diagnosis of high voltage circuit breaker based on multi-sensor information fusion with training weights," Measurement, vol. 192, p. 110894, 2022.

S. Qiu, H. Zhao, N. Jiang, Z. Wang, L. Liu, Y. An, H. Zhao, X. Miao, R. Liu, and G. Fortino, "Multi-sensor information fusion based on machine learning for real applications in human activity recognition: State-of-the-art and research challenges," Information Fusion, vol. 80, pp. 241-265, 2022.

M. B. Cohen, R. K. Said, E. W. Paschal, J. C. McCormick, N. C. Gross, L. Thompson, M. Higginson-Rollins, U. S. Inan, and J. Chang, "Broadband longwave radio remote sensing instrumentation," Review of Scientific Instruments, vol. 89, No. 9, p. 094501, 2018.

(56)            References Cited

OTHER PUBLICATIONS

B. V. Gurses, K. T. Whitmore, and M. B. Cohen, "Ultra-sensitive broadband "awesome" electric field receiver for nanovolt low-frequency signals," Review of Scientific Instruments, vol. 92, No. 2, p. 024704, 2021.

Q. Yang, J. Ruan, Z. Zhuang, and D. Huang, "Condition evaluation for opening damper of spring operated high-voltage circuit breaker using vibration time-frequency image," IEEE Sensors Journal, vol. 19, No. 18, pp. 8116-8126, 2019.

Q. Yang, J. Ruan, and Z. Zhuang, "Fault diagnosis of circuit breakers based on time-frequency and chaotic vibration analysis," IET Generation, Transmission & Distribution, vol. 14, No. 7, pp. 1214-1221, 2020.

A. Korzhov, I. Okrainskaya, A. Sidorov, and V. Kufel'd, "A study of electromagnetic radiation of corona discharge near 500-kv electric installations," Power Technology and Engineering, vol. 38, pp. 57-60, 2004.

S. Kiranyaz, T. Ince, R. Hamila, and M. Gabbouj, "Convolutional neural networks for patient-specific ecg classification," in 2015 37th Annual International Conference of the IEEE Engineering in Medicine and Biology Society (EMBC), pp. 2608-2611, IEEE, 2015.

O. Abdeljaber, O. Avci, S. Kiranyaz, M. Gabbouj, and D. J. Inman, "Realtime vibration-based structural damage detection using one-dimensional convolutional neural networks," Journal of Sound and Vibration, vol. 388 , pp. 154-170, 2017.

L. Eren, T. Ince, and S. Kiranyaz, "A generic intelligent bearing fault diagnosis system using compact adaptive 1" " denn classifier," Journal of Signal Processing Systems, vol. 91, pp. 179-189, 2019.

X. Wang, D. Mao, and X. Li, "Bearing fault diagnosis based on vibroacoustic data fusion and 1d-cnn network," Measurement, vol. 173, p. 108518, 2021.

M. Jalil, F. A. Butt, and A. Malik, "Short-time energy, magnitude, zero crossing rate and autocorrelation measurement for discriminating voiced and unvoiced segments of speech signals," in 2013 The international conference on technological advances in electrical, electronics and computer engineering (TAEECE), pp. 208-212, IEEE, 2013.

R. W. Schafer and L. R. Rabiner, "Digital representations of speech signals," Proceedings of the IEEE, vol. 63, No. 4, pp. 662-677, 1975.

Y. Meng, S. Jia, Z. Shi, and M. Rong, "The detection of the closing moments of a vacuum circuit breaker by vibration analysis," IEEE transactions on power delivery, vol. 21, No. 2, pp. 652-658, 2006.

C.-C. Hsu, G. Frusque, M. Muratovic, C. M. Franck, and O. Fink, "Vacuum circuit breaker closing time key moments detection via vibration monitoring: A run-to-failure study," in 2022 IEEE International Conference on Systems, Man, and Cybernetics (SMC), pp. 254-260, IEEE, 2022.

M. Kim, K. Kim, A. Smajkic, M. Kapetanovic, and M. Muratovic, "Influence of contact erosion on the state of SF6 gas in interrupter chambers of HV SF6 circuit breakers," 2014 IEEE International Power Modulator and High Voltage Conference (IPMHVC), 2014, pp. 466-469.

Wang, Z. (2018). Study on the mechanisms and prediction methods of arcing contact erosion of high-voltage circuit breaker. Available from ProQuest Dissertations & Theses A ProQuest Dissertations & Theses Global (2333803975).

T. S. Sidhu, G. S. Sagoo, and M. S. Sachdev, "Multisensor secondary device for detection of low-level arcing faults in metal-clad MCC switchgear panel," IEEE Trans. Power Del., vol. 17, pp. 129-134, Jan. 2002.

T. S. Sidhu, G. S. Sagoo, and M. S. Sachdev, "On-line detection and location of low-level arcing in dry-type transformers," IEEE Trans. Power Del., vol. 17, pp. 135-141, Jan. 2002.

K. Jakob and W. Schels, "A new, intelligent digital arc detection system for air- and gas-insulated switchgear," in CIRED 97, vol. Conf. Publ. 438, Jun. 1997, pp. 1.32.1-1.32.5.

Rettenmaier, T., et al. "Investigations on contact erosion in vacuum circuit breakers by arc rotation measurements with external mag-netic field sensors." 2012 25th International Symposium on Discharges and Electrical Insulation in Vacuum (ISDEIV). IEEE, 2012. pp. 149-152.

Rettenmaier, T., V. Hinrichsen, and E. Taylor. "Investigations on arc movement in vacuum interrupters by arc rotation measurements with external magnetic field sensors." 2014 International Symposium on Discharges and Electrical Insulation in Vacuum (ISDEIV). IEEE, 2012. pp 201-204.

C. Wang, R. Callan, A. Zajic, and M. Prvulovic, "An algorithm for finding carriers of amplitude-modulated electromagnetic emanations in computer systems," in IEEE 10th European Conf. on Antennas and Propag. (EuCAP), 2016, pp. 1-5.

M. Prvulovic, A. Zaji'c, R. L. Callan, and C. J. Wang, "A method for finding frequency-modulated and amplitude-modulated electromagnetic emanations in computer systems," IEEE Trans. Electromagn. Compat., vol. 59, No. 1, pp. 34-42, 2017.

C. Bayens, T. Le, L. Garcia, R. Beyah, M. Javanmard, and S. Zonouz, "See no evil, hear no evil, feel no evil, print no evil? malicious fill patterns detection in additive manufacturing," Proc. of the 26th USENIX Security Symp., pp. 1181-1198 (1-18), 2017.

Shekari, Tohid, et al. "RFDIDS: Radio Frequency-based Distributed Intrusion Detection System for the Power Grid." NDSS. 2019.

F. Si, C. Yundong, L. Kai, H. Chunguang and L. Jing, "Investigation on arcing behaviors in high-voltage switchgear with a rotary interruption technology," 2017 4th International Conference on Electric Power Equipment—Switching Technology (ICEPE-ST), 2017, pp. 616-619.

H. Janssen, V. Hinrichsen, E. D. Taylor and T. Rettenmaier, "Comparison of Arc Motion in Lifetime Sealed Vacuum Interrupters with Different Bottle Geometries," 2018 28th International Symposium on Discharges and Electrical Insulation in Vacuum (ISDEIV), 2018, pp. 263-266.

H. Janssen, V. Hinrichsen, E. D. Taylor and T. Rettenmaier, "Comparison of Arc Motion in Different Lifetime Sealed Vacuum Interrupters With RMF Contacts," in IEEE Transactions on Plasma Science, vol. 47, No. 8, pp. 3525-3532, Aug. 2019.

N. Guo, K. Whitmore, M. Cohen, T. Shekari, R. Beyah, and L. Graber, "Magnetic Signature of Vacuum Interrupters during Load Switching," In Press. IEEE 40th Electrical Insulation Conference 2022, Knoxville, TN, Jun. 19-23, 2022.

P. H. Roberts, An Introduction to Magnetohydrodynamics. London, United Kingdoms: Longmans, 1967. Part 1.

P. H. Roberts, An Introduction to Magnetohydrodynamics. London, United Kingdoms: Longmans, 1967. Part 2.

K. Nitta et al., "Three-dimensional magnetic field analysis of electrodes for VCBs [vacuum circuit breakers]," in IEEE Transactions on Power Delivery, vol. 12, No. 4, pp. 1520-1525, Oct. 1997.

Yi Wu, Mingzhe Rong, Jian Li and Jianyong Lou, "Calculation of electric and magnetic fields in simplified chambers of low-voltage circuit breakers," in IEEE Transactions on Magnetics, vol. 42, No. 4, pp. 1007-1010, Apr. 2006.

J. Gonzalez, P. Freton, F. Reichert and D. Randrianarivao, "Turbulence and Magnetic Field Calculations in High-Voltage Circuit Breakers," in IEEE Transactions on Plasma Science, vol. 40, No. 3, pp. 936-945, Mar. 2012.

Y. Zhang, X. Yao, Z. Liu, Y. Geng and p. Liu, "Axial Magnetic Field Strength Needed for a 126-kV Single-Break Vacuum Circuit Breaker During Asymmetrical Current Switching," in IEEE Transactions on Plasma Science, vol. 41, No. 6, pp. 1670-1678, Jun. 2013.

L. Xiaozhao, Z. Yang, W. Yuhao, J. Lei and W. Zhengqi, "Magnetic Field Simulation Analysis of New Type Coil-type Axial Magnetic," 2020 IEEE International Conference on Advances in Electrical Engineering and Computer Applications(AEECA), 2020, pp. 337-340.

B. U. Musa, W. H. Siew and M. D. Judd, "Computation of Transient Electromagnetic Fields Due to Switching in High-Voltage Substations," in IEEE Transactions on Power Delivery, vol. 25, No. 2, pp. 1154-1161, Apr. 2010.

R. S. Shi, A. Darcherif and J. C. Sabonnadiere, "Computation of transient electromagnetic fields radiated by a transmission line: An exact model," in IEEE Transactions on Magnetics, vol. 31, No. 4, pp. 2423-2431, Jul. 1995.

(56)                References Cited

OTHER PUBLICATIONS

A. Diamantis and A. G. Kladas, "Mixed Numerical Methodology for Evaluation of Low-Frequency Electric and Magnetic Fields Near Power Facilities," in IEEE Transactions on Magnetics, vol. 55, No. 6, pp. 1-4, Jun. 2019.

J. Gonos et al., "Environmental Impact Analysis of Electric Power Lines," 2018 IEEE International Conference on Environment and Electrical Engineering and 2018 IEEE Industrial and Commercial Power Systems Europe (EEEIC / I&CPS Europe), 2018, pp. 1-5.

N. Ari and W. Blumer, "Transient Electromagnetic Fields Due to Switching Operations in Electric Power Systems," in IEEE Transactions on Electromagnetic Compatibility, vol. EMC-29, No. 3, pp. 233-237, Aug. 1987.

M. Bosworth et al., "Modeling of Reaction Forces in High-Voltage Substation Structures," in IEEE Transactions on Power Delivery, vol. 33, No. 4, pp. 1510-1517, Aug. 2018.

M. A. Uman, D. K. McLain, and E. P. Krider, "The electromagnetic radiation from a finite antenna," in American Journal of Physics, vol. 43, No. 1, pp. 33-38, Jan. 1975.

B. Nekhoul, R. Feuillet, J. C. Sabonnadiere, L. Quinchon and F. Morillon, "Prediction of transient electromagnetic environment in power networks," in IEEE Transactions on Magnetics, vol. 30, No. 5, pp. 3745-3748, Sep. 1994.

M. Mohana Rao, M. J. Thomas and B. P. Singh, "Computation of EMI fields in a high voltage gas insulated substation during switching operations," 2003 IEEE Symposium on Electromagnetic Compatibility. Symposium Record (Cat. No. 03CH37446), 2003, pp. 743-748.

J. Heberlein, J. Mentel, and E. Pfender, "The anode region of electric arcs: A survey," in Journal of Physics D: Applied Physics, vol. 43, No. 2. Dec. 2010.

C. W. Kimblin, "Anode voltage drop and anode spot formation in dc vacuum arcs," in Journal of Applied Physics, vol. 40, No. 4, pp. 1744-1752, Oct. 1969.

I. I. Beilis, "Vacuum Arc Cathode Spot Theory: History and Evolution of the Mechanisms," in IEEE Transactions on Plasma Science, vol. 47, No. 8, pp. 3412-3433, Aug. 2019.

P. G. Slade and M. D. Nahemow, "Initial Separation of Electrical Contacts Carrying High Currents," in Journal of Applied Physics, vol. 42, No. 9, pp. 3290-3297, 1971.

J. V. R. Heberlein and J. G. Gorman, "The High Current Metal Vapor Arc Column between Separating Electrodes," in IEEE Transactions on Plasma Science, vol. 8, No. 4, pp. 283-288, 1980.

P. Slade, "The Vacuum Interrupter Contact," in IEEE Transactions on Components, Hybrids, and Manufacturing Technology, vol. 7, No. 1, pp. 25-32, 1984.

R. Haug and T. Kouakou, "Phenomena preceding arc ignition between opening contacts: experimental study and theoretical approach," Thirty-Sixth IEEE Conference on Electrical Contacts, and the Fifteenth International Conference on Electrical Contacts, 1990, pp. 543-549.

M. Schulman, "Separation of spiral contacts and the motion of vacuum arcs at high AC currents," IEEE Transactions on Plasma Science, vol. 21, No. 5, pp. 484-488, 1993.

K. Watanabe, E. Kaneko, and S. Yanabu, "Technological progress of axial magnetic field vacuum interrupters," IEEE Transactions on Plasma Science, vol. 25, No. 4, pp. 609-616, 1997.

Y. Langlois, p. Chapelle, A. Jardy, and F. Gentils, "On the numerical simulation of the diffuse arc in a vacuum interrupter," in Journal of Applied Physics, vol. 109, No. 11, pp. 113306-01-113306-12, 2011.

Y. Niwa, R. Palad, K. Sasage and W. Sakaguchi, "Vacuum arc behavior in transversal magnetic field electrode of Vacuum Interrupter," 2012 25th International Symposium on Discharges and Electrical Insulation in Vacuum (ISDEIV), 2012, pp. 505-508.

* cited by examiner

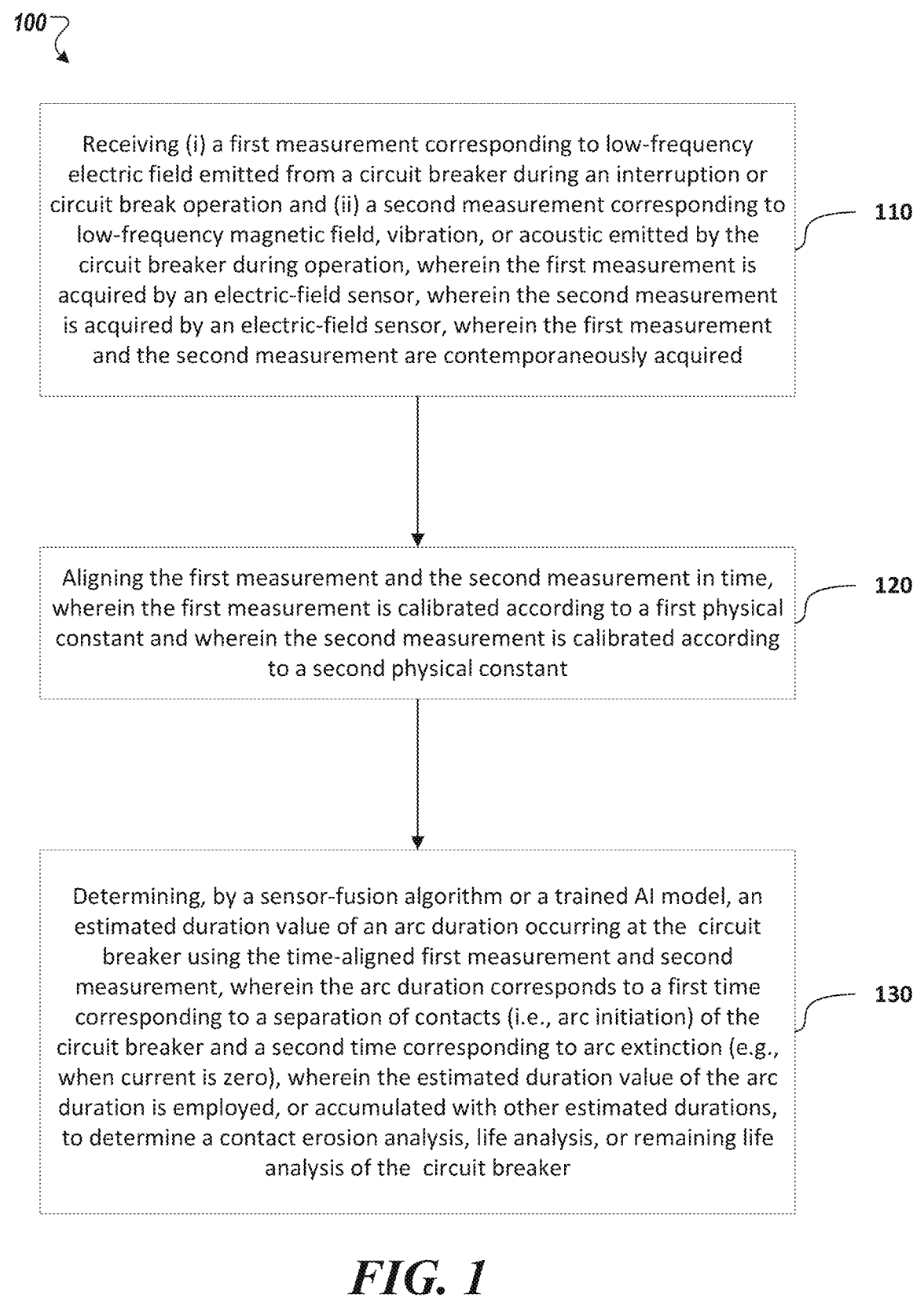

100

Receiving (i) a first measurement corresponding to low-frequency electric field emitted from a circuit breaker during an interruption or circuit break operation and (ii) a second measurement corresponding to low-frequency magnetic field, vibration, or acoustic emitted by the circuit breaker during operation, wherein the first measurement is acquired by an electric-field sensor, wherein the second measurement is acquired by an electric-field sensor, wherein the first measurement and the second measurement are contemporaneously acquired — 110

Aligning the first measurement and the second measurement in time, wherein the first measurement is calibrated according to a first physical constant and wherein the second measurement is calibrated according to a second physical constant — 120

Determining, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero), wherein the estimated duration value of the arc duration is employed, or accumulated with other estimated durations, to determine a contact erosion analysis, life analysis, or remaining life analysis of the circuit breaker — 130

*FIG. 1*

VACUUM
INTERRUPTER

E-FIELD
DIPOLE
ANTENNA

ACCELEROMETER

MICROPHONE

B-FIELD COIL
ANTEANNA

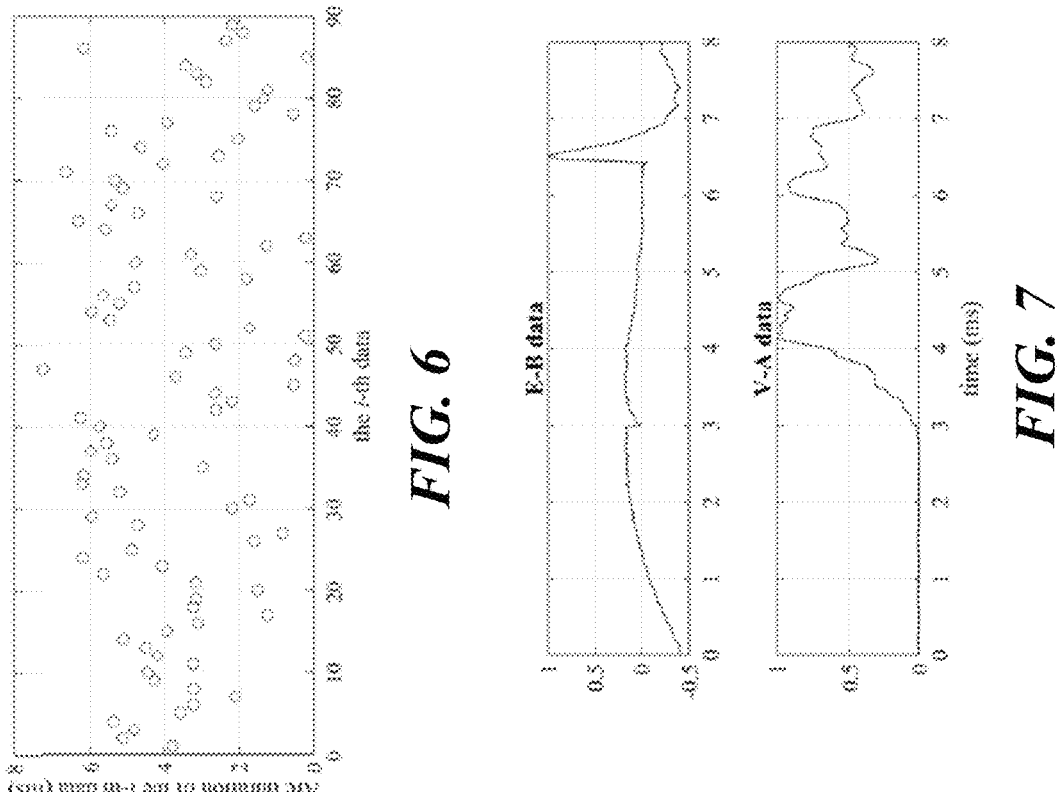
FIG. 6
FIG. 7
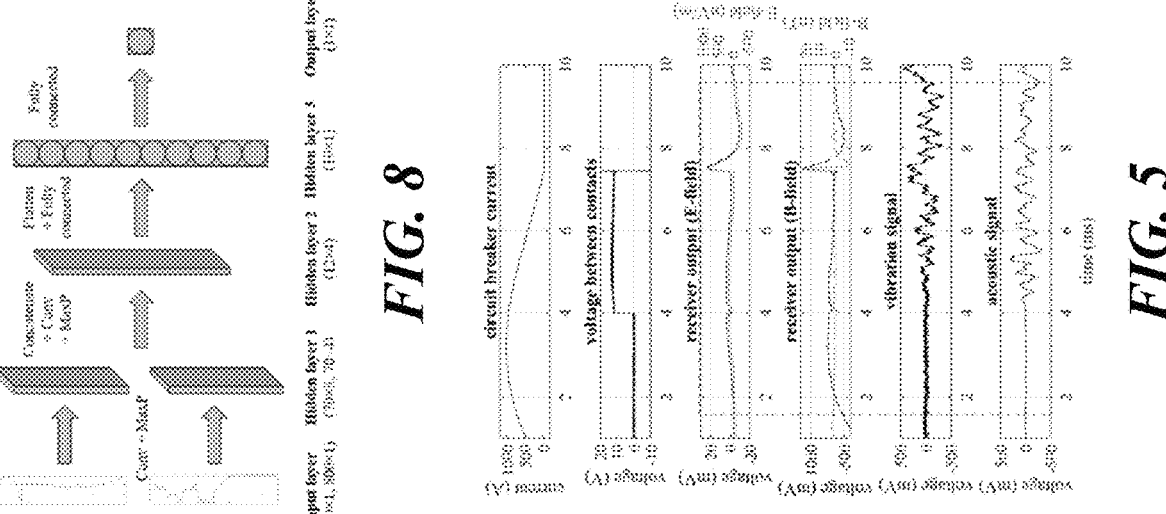
FIG. 8
FIG. 5

SYSTEM AND METHODS FOR MEASURING ARC DURATION

RELATED APPLICATION

This application claims priority to, and the benefit of, U.S. Provisional Patent Application No. 63/499,062, filed Apr. 28, 2023, entitled "System and Methods for Measuring Arc Duration of Vacuum Circuit Breakers," which is incorporated by reference herein in its entirety.

STATEMENT REGARDING FEDERALLY SPONSORED RESEARCH OR DEVELOPMENT

This invention was made with government support under grant no. 1929580 awarded by the National Science Foundation. The government has certain rights in the invention.

BACKGROUND

Vacuum interrupters are installed in the power grid for a wide variety of uses. With an increasing share of distributed generation, they see more switching operations, which makes them more susceptible to contact wear and reduced life expectancy. Studies have shown the relationship between arc duration and contact mass loss during load switching as well as the application of accumulative arc duration in contact wear estimation and circuit breaker condition-based maintenance.

There is a benefit to improving sensors for reliably monitoring and/or measuring circuit breaker switching.

SUMMARY

Systems, methods, and devices are described herein for sensing the operation of electrical equipment using multi-fusion approaches. Example embodiments of the present disclosure include systems, methods, and devices for detecting electrical arcs and/or determining the duration of electrical arcs. Electrical arcs can form when two energized electrical contacts separate, and the voltage between the contacts ionizes air (or other material) between the contacts to allow electricity to flow through the ions between the separated contacts. Electrical arcs can generate large amounts of heat and can be damaging both to equipment and workers.

An exemplary method is described herein that can be used to determine and/or estimate arc duration in circuit breakers. The example method described herein can be used, for example, to improve estimates/measurements of circuit breaker contact erosion. Contact erosion can be used as a factor for predicting circuit breaker reliability and/or lifespan. The exemplary method includes sensor fusion algorithms and/or AI (artificial intelligence) models that improve the detection of electrical arcs and/or measurement of electrical arcs (e.g., arc duration), allowing for non-invasive sensing of arc duration.

In an aspect, a method is disclosed of determining arc duration in a circuit breaker (e.g., vacuum interrupters, $SF_6$ circuit breaker, etc.), the method comprising: receiving (i) a first measurement corresponding to a low-frequency electric field emitted from a circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired; aligning the first measurement and the second measurement in time, wherein the first measurement is calibrated according to a first physical constant and wherein the second measurement is calibrated according to a second physical constant; and determining, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero), wherein the estimated duration value of the arc duration is employed, or accumulated with other estimated durations, to determine a contact erosion analysis, life analysis, or remaining life analysis of the circuit breaker.

In some embodiments, the first measurement comprises a low-frequency electric field signal, wherein the second measurement comprises a low-frequency magnetic field signal.

In some embodiments, the first measurement comprises a low-frequency electric field signal, wherein the second measurement comprises a low-frequency vibration signal.

In some embodiments, the first measurement comprises a low-frequency electric field signal, wherein the second measurement comprises a low-frequency acoustic signal.

In some embodiments, the trained AI model comprises a 1D CNN (one-dimensional convolutional neural network) model (e.g., multi-input 1D CNN model).

In some embodiments, the first measurement is acquired via a dipole antenna positioned a distance from the circuit breaker.

In some embodiments, the second measurement is acquired via a magnetic field coil antenna, a microphone, an accelerometer, or a combination thereof.

In some embodiments, the microphone is insulated on a shock mount to decouple seismic (vibration) wave from sound waves associated with the interruption or circuit break operation.

In some embodiments, the circuit breaker is employed for distribution load switching, fault protection, or capacitor bank insertion and disconnection.

In some embodiments, the estimated duration value is employed in a subsequent arc energy/duration-based contact erosion analysis.

In another aspect, a system is disclosed comprising a processor; and a memory having instructions stored thereon, wherein execution of the instructions by the processor causes the processor to: receive (i) a first measurement corresponding to a low-frequency electric field emitted from a circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired; align the first measurement and the second measurement in time, wherein the first measurement is calibrated according to a first physical constant and wherein the second measurement is calibrated according to a second physical constant; and determine, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero), wherein the estimated duration value of the arc duration is employed, or accumulated with other estimated durations, to determine a contact erosion analysis, life analysis, or remaining life analysis of the circuit breaker.

In some embodiments, the first measurement comprises a low-frequency electric field signal, wherein the second measurement comprises a low-frequency magnetic field signal.

In some embodiments, the first measurement comprises a low-frequency electric field signal, wherein the second measurement comprises a low-frequency vibration signal.

In some embodiments, the first measurement comprises a low-frequency electric field signal, wherein the second measurement comprises a low-frequency acoustic signal.

In some embodiments, the trained AI model comprises a 1D CNN model (e.g., multi-input 1D CNN model).

In some embodiments, the first measurement is acquired via a dipole antenna positioned a distance from the circuit breaker.

In some embodiments, the second measurement is acquired via a magnetic field coil antenna, a microphone, an accelerometer, or a combination thereof.

In some embodiments, the microphone is insulated on a shock mount to decouple seismic (vibration) waves from sound waves associated with the interruption or circuit break operation.

In some embodiments, the estimated duration value is employed in a subsequent arc energy/duration-based contact erosion analysis.

In another aspect, a non-transitory computer-readable medium is disclosed having instructions stored thereon, wherein execution of the instructions by a processor causes the processor to: receive (i) a first measurement corresponding to a low-frequency electric field emitted from a circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired; align the first measurement and the second measurement in time, wherein the first measurement is calibrated according to a first physical constant and wherein the second measurement is calibrated according to a second physical constant; and determine, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero), wherein the estimated duration value of the arc duration is employed, or accumulated with other estimated durations, to determine a contact erosion analysis, life analysis, or remaining life analysis of the circuit breaker.

BRIEF DESCRIPTION OF THE DRAWINGS

The skilled person in the art will understand that the drawings described below are for illustration purposes only.

FIG. 1 shows an example method of determining an estimated duration value of an arc duration occurring at a circuit breaker, according to an illustrative embodiment of the present disclosure.

FIG. 3 shows an example circuit diagram for a synthetic test circuit and magnetic field measurement system employed in a study of an illustrative embodiment of the present disclosure.

FIG. 5 shows aligned raw measurements with an 8-ms sliding window from a study of an illustrative embodiment of the present disclosure.

FIG. 6 shows example statistics collected from a study of an illustrative embodiment of the present disclosure.

FIG. 7 shows E-field and B-field (E-B) data and vibration-acoustic (V-A) data collected from a study of an illustrative embodiment of the present disclosure.

FIG. 8 shows an example architecture of a multi-input 1D CNN for arc duration measurement, according to an illustrative embodiment of the present disclosure.

DETAILED SPECIFICATION

Figure 2:
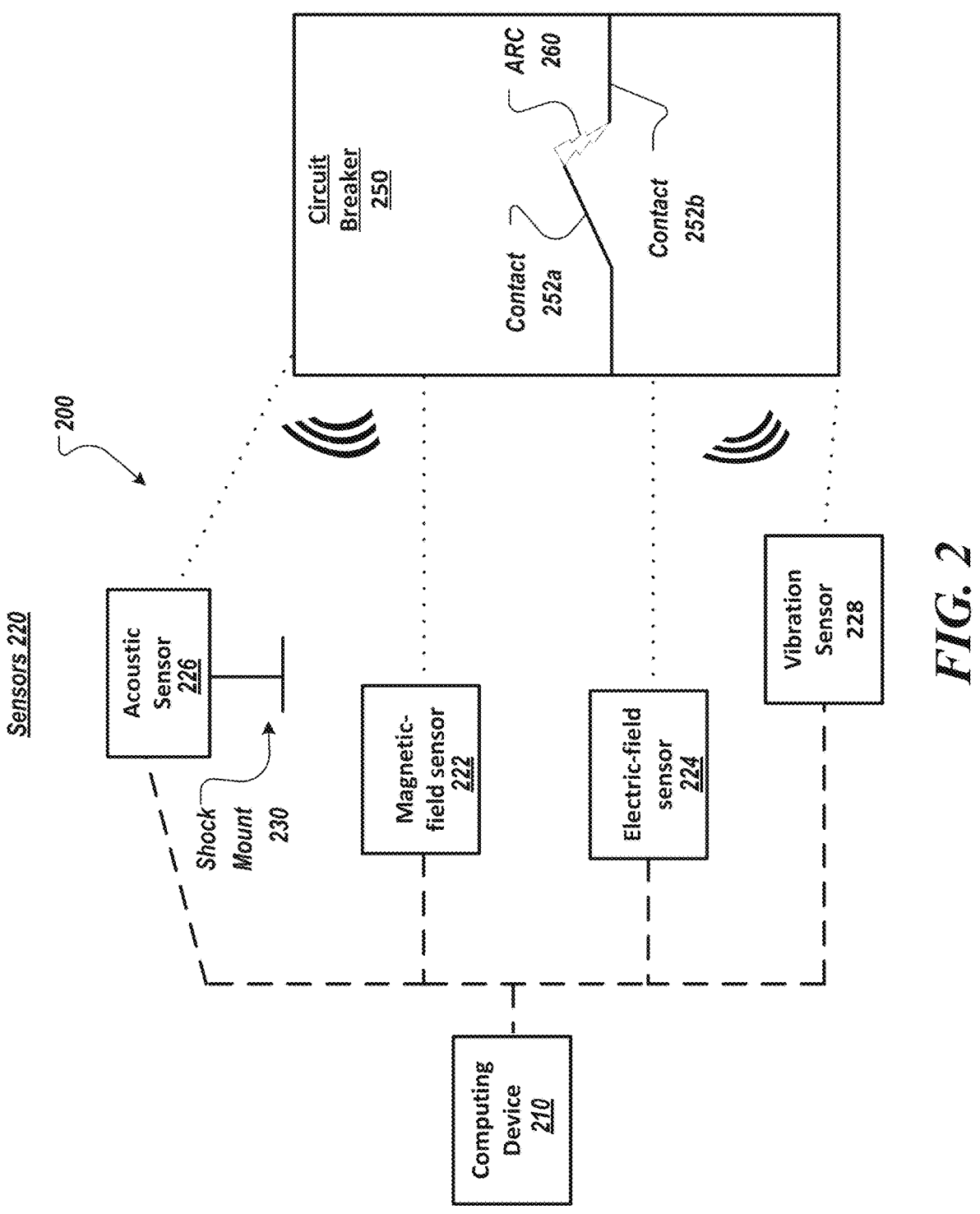
FIG. 2 shows an example system block diagram for a system that can be used to determine an estimated duration value of an arc duration at a circuit breaker, according to an illustrative embodiment of the present disclosure.

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. For example, [1] refers to the first reference in the list. All references cited and discussed in this specification are incorporated herein by reference in their entireties and to the same extent as if each reference was individually incorporated by reference.

Vacuum interrupters are extensively deployed in the power grid for multiple purposes, including distribution load switching, fault protection, and capacitor bank insertion and disconnection [1]. With the growing integration of distributed generation, the increased frequency of switching operations has led to a heightened susceptibility of these devices to contact erosion and reduced longevity. Switching can generate wear on contacts of switching components, including vacuum interrupters.

Embodiments of the present disclosure improve existing measurements of contact erosion. Prior techniques, such as dynamic resistance measurement (DRM) and the arc energy/duration-based contact erosion analysis, are techniques for assessing circuit breaker contact wear [2,3]. DRM is an effective method for evaluating the condition of main and arcing contacts [4-7]. However, the limitations of DRM include its inability to detect the early stages of contact erosion [3,8], and its offline execution, thereby limiting its practicality in online VI condition monitoring.

Existing "invasive" or "direct" methods of inspecting circuit breaker contacts like DRM can require that the breaker be opened and inspected or for sensors to be installed in the switching device. Disadvantages of invasive methods of circuit breaker inspection include opening the circuit breaker (which can optionally be a sealed circuit breaker), dangers from high voltage (commercial vacuum circuit breakers can operate in excess of 35,000 volts), and the potential requirement that the breaker be taken out of service for inspection (electrical systems are often expected to have very high uptime).

An example of a direct method includes measuring the voltage between contacts [11, 18] and the travel curve [19]. However, both techniques are hard to implement in practice due to the difficulty of measuring arc voltage accurately while withstanding severe transient recovery voltage [3,16] and the vibration interference during circuit breaker operations [20]. Various non-invasive measurement methods have also been studied, including infra-red [21], acoustic [21, 22], and electric and magnetic fields at very-high-frequency (VHF) and ultrahigh-frequency (UHF) bands [20, 23], as well as auxiliary contact timing [24]. These methods are limited by a variety of factors: installation difficulties of infra-red and optical sensors [20], acoustic noise [2], electromagnetic interference from corona discharge, dependence on auxiliary contact, etc. Existing techniques for measuring arc duration are associated with implementation challenges, limited accuracy, and inadequate reliability, which can, therefore, benefit from the more robust and accurate methods described herein.

The direct and invasive methods of evaluating contact wear and lifespan have disadvantages that can be overcome using embodiments of the present disclosure that allow for noninvasive sensing of arc duration and, therefore, noninvasive sensing and analysis of contact erosion, circuit breaker life, and/or remaining life.

Additionally, embodiments of the present disclosure apply trained machine learning (e.g., AI) models to combine different signals with complicated relationships. For example, an electromagnetic signal (low-frequency and very-low-frequency electric field and low-frequency and very-low-frequency magnetic field) and mechanical signal (vibration, sound) are measurements of different physical phenomena. The relationships between the various electromagnetic signals and mechanical signals described herein can be non-linear, and the relationships between various signals and arc duration can also be non-linear. Therefore, machine learning methods are improvements for determining these relationships. Alternatively, or additionally, determining arc duration based on the electromagnetic signal can require recognizing specific waveform signatures, and determining arc duration based on the mechanical signal can require understanding the complex relationship between the vibration (or sound) and the arc initiation time. Embodiments of the present disclosure include machine learning methods that can be used to improve both the determination of arc duration based on mechanical signals and the arc initiation time and/or the identification and/or measurement of specific waveform signatures that can be used to detect and/or measure arc duration.

While embodiments of the sensing systems, methods, and devices are described in the context of detecting and measuring circuit breaker arcs (e.g., vacuum circuit breaker arcs), it should be understood that any electrical equipment and/or electrical device can generate arcs; for example, interrupters and switches can include contacts similar to circuit breakers, and can likewise generate arcs when opened. Embodiments of the present disclosure include sensing systems, methods, and devices that can be applied to any arc-quenching electrical equipment/machine" and/or any electrical equipment/machine designed for arc quenching and/or load-switching purposes. Additional non-limiting examples of electrical equipment/machines that can be used for arc quenching/load switching include vacuum circuit breakers, minimum-oil circuit breakers, SF6 circuit breakers, oil circuit breakers, and any other types of circuit breakers, as well as load interrupters, and switchgear. Additionally, arcs can be created by equipment faults, including fallen lines, damaged equipment, and lightning. It should be understood that embodiments of the present disclosure can be used for sensing any kind of arc for any purpose and that the example applications herein are intended to be non-limiting examples.

Example embodiments include analyses based on arc energy/duration. Contact mass loss in each current interruption can be ascertained by evaluating the arcing time [9]-[13], transferred electric charge [11], [13], and arc energy [12]-[16]. Embodiments s of the present disclosure can use the relationship between arc energy and duration to estimate the remaining lifespan of contacts. The relevant formulas for transferred charge and arc energy are provided in Equations 1 and 2, respectively. Typically, the arc current can be obtained from a current transformer. For a vacuum circuit breaker, the arc voltage remains relatively constant during the arcing process and is primarily dependent on the contact materials [1,17]. Therefore, the only unknown parameter that needs to be determined for contact erosion analysis is the arc duration.

$$Q_{transfer} = \int_{t_{arc}} |i_{arc}(t)| dt \qquad \text{(Eq. 1)}$$

$$E_{arc} = \int_{t_{arc}} u_{arc}(t) \cdot i_{arc}(t) dt \qquad \text{(Eq. 2)}$$

The example embodiments described herein include a duration measurement method and system that leverages multi-sensor fusion [25]-[27]. Specifically, very-low-frequency (VLF) and low-frequency (LF) electric and magnetic field, vibration, and acoustic signals are fused using different algorithms by the example method to determine the arc duration. The approach is designed to be robust against noise interference, delay, and sensor failure.

Example Method of Determining Arc Duration

FIG. 1 illustrates a method 100 of determining arc duration according to embodiments of the present disclosure. Methods according to embodiments of the present disclosure can be used for non-invasively determining/measuring arc duration in electrical devices (e.g., vacuum circuit breakers) as shown in FIG. 1. It should be understood that the vacuum circuit breaker described in method 100 is intended only as a non-limiting example.

At step 110, the method includes receiving measurements of low-frequency electric and/or magnetic fields. Optionally, the measurements can include a first measurement of a low-frequency electric field and a second measurement corresponding to a low-frequency magnetic field. In the example method 100, the electric and/or magnetic fields can be electric and/or magnetic fields created by the operation of a vacuum circuit breaker (e.g., the circuit opening to interrupt the flow of electricity). As used herein, a "low frequency" signal can refer to a signal that is approximately 30 kHz-300 kHz, and a "very low frequency" signal can refer to a signal that is approximately 3 Hz-30 kHz. Optionally, embodiments of the present disclosure can use frequencies lower and/or higher than low frequency and/or very low frequency, as well as combinations of signals in the low-frequency and/or very low-frequency bands.

Electric field measurements can be acquired by one or more electric field sensors, and magnetic field measurements can be acquired by one or more magnetic field sensors. A non-limiting example of an electromagnetic field sensor includes antennas (e.g., dipole antennas).

In some embodiments of the present disclosure, additional measurements can be used. For example, in some embodiments of the present disclosure the first and/or second measurement can include an acoustic signal and/or vibration signal. Acoustic signals and vibration signals can be acquired using acoustic and vibration sensors, as described in greater detail with reference to FIG. 2. An example vibration signal can be a signal acquired from an accelerometer in the range of 0-27 kHz, and an example acoustic signal can include a microphone configured to measure between 20 Hz-20 kHz. In some embodiments of the present disclosure, the accelerometer and/or microphone are configured to measure different bands of vibration and/or acoustic signals.

Sensors, including electric and magnetic field sensors, are described in greater detail with reference to the system 200 of FIG. 2 and the study described herein.

It should also be understood that embodiments of the present disclosure contemplate that any number of measurements can be combined using the sensor fusion algorithms and machine learning models described herein. Optionally, any number of acoustic signals, vibration signals, electric field signals, and/or magnetic field signals can be used.

The operation of a circuit breaker can further generate mechanical vibration and/or acoustic waves (e.g., sounds).

At step 120 the method can include aligning the first and second measurements in time. Optionally, both the first and second measurements can be calibrated before and/or after aligning the first and second measurements.

At step 130, the method can include determining an estimated duration value of an arc duration. As used herein, the "arc duration" corresponds to a first time corresponding to a separation of contacts (i.e., arc initiation) of the vacuum circuit breaker and a second time corresponding to arc extinction (e.g., when current is zero).

Step 130 can be performed using a sensor-fusion algorithm and/or trained AI model and the time-aligned first measurement and second measurement. Optionally, the trained AI model can be a 1D CNN model (e.g., multi-input 1D CNN model). Additional description of a trained 1D CNN model according to embodiments of the present disclosure is described in the study herein.

Optionally, the estimated duration value can be stored, transmitted, and/or recorded. The estimated duration value can be used to determine a contact erosion analysis, life analysis, or remaining life analysis of the vacuum circuit breaker. In some embodiments, the method can include generating a dataset including multiple estimated duration values that correspond to different arcs. The combined duration values from the different arcs can be used to determine a total erosion, total life analysis, or total remaining life analysis representing the cumulative effect of repeated arcs. Additional example analyses that can be performed using one or more estimated duration values include arc energy/duration-based contact erosion analysis.

With reference to FIG. 2, an example system 200 is shown that can be used to implement embodiments of the present disclosure, including the methods described with reference to FIG. 1. The system 200 includes a computing device 210 operably coupled to one or more sensors 220. Optionally, the computing device is configured to perform any of the methods described with reference to FIG. 1, and the computing device can alternatively or additionally include trained machine learning models configured to perform the methods of FIG. 1.

The system 200 shown in FIG. 2 is configured to measure/detect an arc created in a circuit breaker 250. The system 200 can measure and detect the signals that propagate when an arc is created and/or extinguished in the circuit breaker 250, which can be used to measure the arc duration and/or wear on the circuit breaker 250 by implementing any combination of the methods described with reference to FIG. 1. As described with reference to FIG. 1, other electrical devices can be used in place of the circuit breaker 250 shown in FIG. 2. Any arc created by any electric device can be measured and/or detected by the system 200 shown in FIG. 2.

In FIG. 2, an example circuit breaker 250 is shown, including contacts 252a and 252b. The circuit breaker can be any kind of circuit breaker (e.g., a vacuum circuit breaker or interrupter). Alternatively, or additionally the circuit breaker can be filled with air, an inert gas, and can include features configured to limit arcing between the contacts.

As the contacts 252a and 252b separate, as shown in FIG. 2, an arc 260 can form between the contacts. The movement of the contacts 252a, 252b, and other components of the circuit breaker, as well as the formation and extinguishing of the arc, can generate a variety of electromagnetic, acoustic, vibrational, and other signals.

The system 200 can include a computing device 210 operably coupled to any number of sensors 220. The sensors 220 can be positioned at any position and/or orientation relative to the circuit breaker.

Optionally, the sensors 220 can include a magnetic field sensor 222, an electric field sensor 224, an acoustic sensor 226, and a vibration sensor 228. In some embodiments of the present disclosure, fewer sensors 220 can be used, and in other embodiments of the present disclosure, additional sensors 220 can be used. For example, any number of magnetic field sensors 222, electric field sensors 224, acoustic sensors 226, and vibration sensors 228 can be used in embodiments of the present disclosure.

In some embodiments of the present disclosure, the magnetic field sensor 222 is a loop antenna. A non-limiting example of a loop antenna that can be used is a 95-turn, 76.2 mm diameter loop antenna.

In some embodiments of the present disclosure, the electric field sensor 224 is a dipole antenna. A non-limiting example of a dipole antenna that can be used is a 600 mm dipole antenna.

The type and dimensions of magnetic field sensors 222 and electric field sensors 224 described herein are intended only as non-limiting examples. As described with reference to FIG. 1, embodiments of the present disclosure can sense different ranges of frequencies of magnetic and/or electric fields, and embodiments of the present disclosure can include any antenna/receiver dimensions/structure/configuration that is suitable for measuring the electric and magnetic fields described herein, including combinations of multiple antennas and/or receivers.

In some embodiments of the present disclosure, the acoustic sensor 226 is a microphone. In some embodiments of the present disclosure, the vibration sensor 228 includes an accelerometer. The vibration sensor 228 can be configured to measure the vibration/movement of the circuit breaker 250 (e.g., mounted to the housing of the circuit breaker or on the same surface as the circuit breaker). Optionally, the accelerometer can be coupled to a frame or surface adjacent to or in direct or indirect contact with the circuit breaker 250.

Optionally, any or all of the sensors described herein can be isolated from the environment (e.g., a surface) to improve the quality of the signal. For example, the acoustic sensor 226 can be mounted on a shock mount 230 to reduce the effect of physical vibration on the microphone signal.

Experimental Results and Examples

Synthetic Test Circuit Schematic

FIG. 3 depicts a circuit diagram of a synthetic test circuit used in the study. To interrupt the alternating current produced by the LC circuit, a vacuum interrupter (VI) sold under the trademark EATON SL-160 was used with an axial magnetic field design. During the experiments, the current at node 1 ($I_1$) and the contact voltage difference ($V_{1to2}$) are both recorded. The current interruption experiment procedure used in the study was:

Step 1: open $S_1$ and close VI

Step 2: charge $C_1$

Step 3: close $S_1$ (start of current)

Step 4: open VI (arc initiation)

Step 5: arc extinction/current interruption

Experimental Sensor Setup

The measurements of VLF (3-30 kHz) and LF (30-300 kHz) magnetic and electrical fields can optionally be performed using specialized receivers. In particular, a 95-turn 76.2 mm-diameter loop antenna was used to measure the B-field, whereas an E-field dipole antenna with a length of 600 mm was employed to measure the E-field. Other non-limiting example loop antenna dimensions include between 70 and 80 mm, and it should be understood that the dimensions of the antennas described herein can be configured based on the thickness of the wires used, tapes used, and other parameters in implementations of the present disclosure. These antennas capture signals that are subsequently transmitted to a low-noise pre-amplifier, which, in turn, transmits the signals to an "Air-gapped Distributed Intrusion Detection System, referred to herein as a receiver. This receiver [28], [29] has a sensitivity as low as 0.03 fT/√Hz and a flat amplitude response across a wide frequency range of 3 kHz to 400 kHz. The reason for focusing on these frequency bands herein is that they are primarily utilized in scientific research and military operations, like submarine communications, resulting in a very low noise level. It should be understood that other frequency bands can be used in other embodiments of the present disclosure.

In order to minimize the impact of other circuit components on the E-field and B-field measurements, the primary circuit components were enclosed within a grounded steel container, and the coil inductor was wrapped with mu-metal (nickel-iron alloy) foil. Additionally, the components were positioned at a distance of 10 meters from the antennas, while the VI was placed within a 1/−1-meter range of the antennas. The magnitude of the electromagnetic field in the near-field region proportionally decreases to the square or cube of the distance, depending on the models used (dipole or loop). This attenuation further reduces the level of interference.

Figure 4:
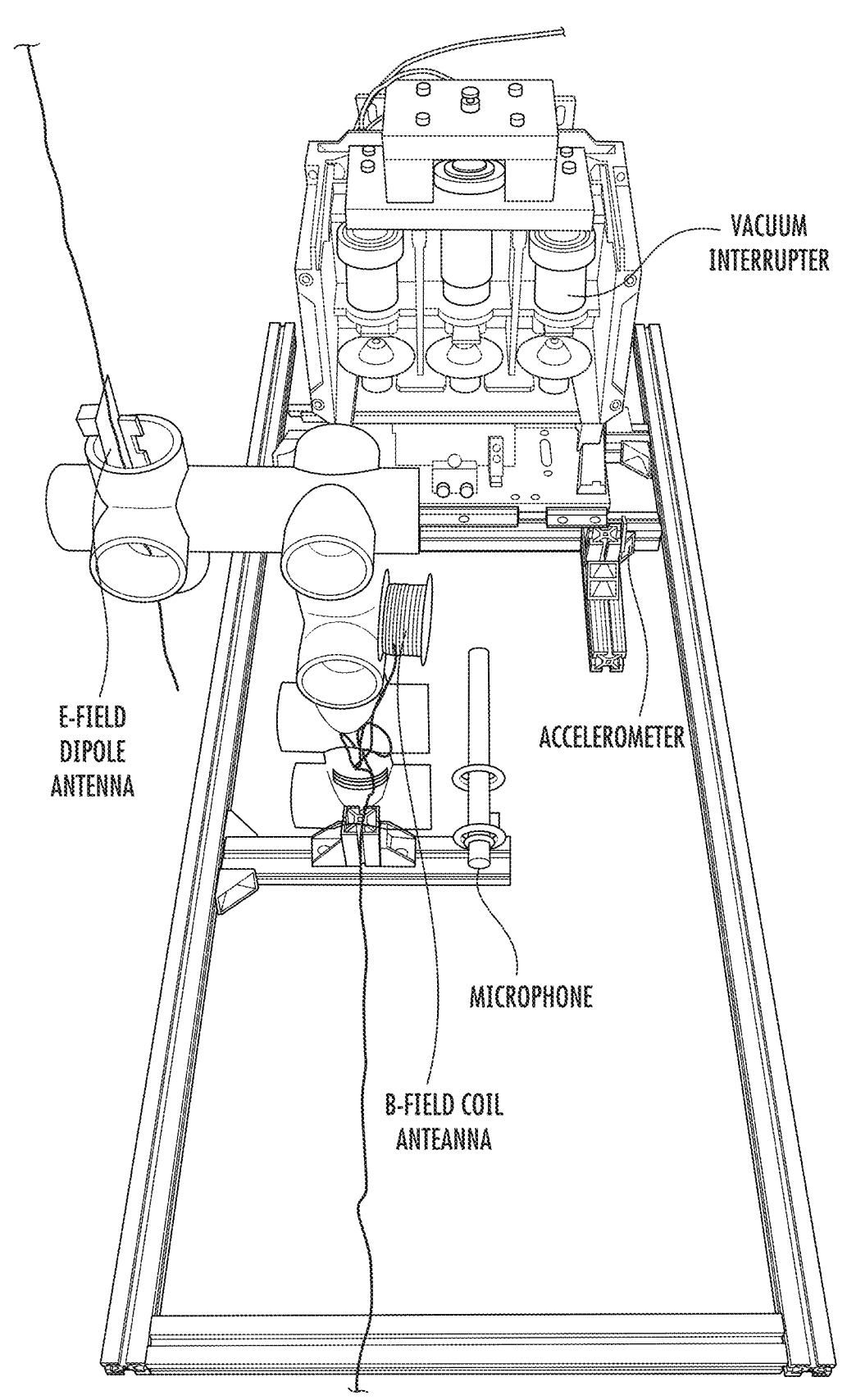
FIG. 4 shows an example experimental setup including a vacuum interrupter, E-field dipole antenna, b-field coil antenna, microphone, and accelerometer employed in a study of an illustrative embodiment of the present disclosure.

The measurements of vibration and acoustic signals during circuit breaker operation were conducted using an accelerometer (0-27 kHz) and a condenser microphone (20 Hz-20 kHz). The vibration frequency of VI can be below 30 kHz [30], [31], indicating that the selected sensors can capture crucial information during VI operations. FIG. 4 illustrates that in the example experimental setup, all sensors, and the VI are secured on an aluminum frame to prevent any relative location changes between the sensors and the VI, which could be caused by the vibrations from repeated VI operations. Additionally, the microphone was mounted on the rail using a shock mount to decouple the seismic (vibration) wave from the sound wave, as the former arrived earlier.

Data Alignment

The receiver was utilized for measuring the E-field and B-field, and the Coordinated Universal Time (UTC) obtained from the Global Positioning System (GPS) was automatically implemented as the time stamp for the signals. The vibration and sound signals were gauged through the application of an oscilloscope. In order to align the signals, the receiver transmits a pulse every second to the oscilloscope based on the GPS signal. This action serves to include a UTC time stamp to an oscilloscope, thereby ensuring synchronization between measurements from these sensors.

Since the speeds of electromagnetic waves and mechanical waves are different, the propagation delay is also considered in the example data alignment process used in the study. The speed of sound in air is a well-known physical constant with a value of 343 m/s. The velocity of the vibration signal can be calculated utilizing Equation 3, where E represents the Young's modulus of the material and $\rho$ indicates the material's density. As the accelerometer and VI are fixed onto the same aluminum rail, it is assumed that the speed of vibration waves at various frequencies and the seismic dispersion can be neglected due to the uniform density of the rail. By determining the distance between the VI and the two sensors, the propagation delay in vibration and sound signals can be calculated.

$$v = \sqrt{E/\rho} \qquad \text{(Eq. 3)}$$

FIG. 5 shows a collection of aligned signals, including $I_1$, $V_{1to2}$, E-field, B-field, vibration signal, and acoustic signal, arranged from top to bottom. The E-field and B-field signals are presented in voltage, which are the unprocessed output signals from the receiver. The calibration of the VLF and LF B-field was performed utilizing the method outlined in [28], and the calibrated signal is depicted in the orange curve. A previous study reported a maximum magnetic field strength of 4.72 µA/rm in the VLF range measured at the Shagol 500 kV substation [32], which is equivalent to 5.66 pT when considering the permeability of free space, suggesting that the captured Bfield in this paper is exceedingly strong, even in a substation environment.

However, calibrating the E-field sensor can be more complex, as discussed in [29]. Alternatively, or additionally, a straightforward method can be employed. Since the focus is on the VLF and LF bands, the amplitude response within this range can be set to be nearly constant (approximately 33 µV/m/V). By dividing the amplitude response, the E-field can be calibrated, producing the same calibrated signal shown in orange. Optionally, the raw measurements can be used as inputs as the calibration process adds complexity to the method.

The change of $V_{1 \text{ to } 2}$ from 0 to 12 V serves as an indication of the separation of contacts (i.e., arc initiation), and the subsequent current zero signifies the arc extinction. The duration between these two events is referred to as arcing time. During load switching, different quantities show distinct patterns. B-field changes due to the change of current amplitude and current path (contact separation), and these changes, after being filtered by the receiver, become special waveforms occurring at the contact separation time and arc extinction time. Similar waveforms can also be observed in the E-field. With respect to vibration and acoustic signals, their amplitudes exhibit significant increases following the contact separation, which is caused by the vibration of the mechanical structure during load switching.

In FIG. 5, an 8-millisecond sliding window is used. This window can be moved towards the left or right (e.g., forward and backward in time through the collected data), allowing for the extraction of different data segments with a fixed length. An 8-ms sliding window is intended only as a non-limiting example. As described herein, the sliding window that can be used for data processing will be discussed in greater detail.

Experimental Arc Duration Measurement Scheme

1-Dimensional Convolutional Neural Network

Measuring the arc duration using multi-sensor data can be performed using a fusion algorithm in embodiments of the present disclosure. Since each signal can have specific features that can indicate the arc initiation or extinction, the algorithm can be an algorithm capable of extracting waveform patterns. Moreover, electromagnetic fields and mechanical waves are fundamentally different, so the algorithm can fuse input quantities in a nonlinear way before determining the arcing time.

A 1-dimensional convolutional neural network (1D CNN) is a powerful deep learning algorithm that can be used in time series analysis [33-36]. It combines feature extraction, data fusion, and result prediction together and thus can be used in embodiments of the present disclosure, including the study described herein. A 1D CNN consists of several layers, including convolutional (Conv) layers, pooling layers, and fully connected layers. In the Conv layers, the input data are convolved with a set of 1D learnable filters in the time domain. The process is the same as the wavelet transform, except that learnable filters are used instead of the pre-defined wavelets. Specifically, when a filter is applied to a segment of the time series, it computes a dot product between the filter weights and the corresponding data points. By sliding different filters across the entire time series, they can recognize different features at various time points and store them in several vectors, called feature maps. Feature maps are then passed through a non-linear activation function to produce output tensors for the next layers. The filter weights are learned during the training process and are optimized to detect specific patterns of input data. An example filter for extracting the feature of linear changing is shown in Equation 4. However, the length of the filter used in practice can vary. Short filters can capture variations that occur in shorter periods, while larger filters are better suited for detecting longer-term changes.

$$\text{Filter} = (-2, -1, 0, 1, 2) \qquad \text{(Eq. 4)}$$

The output tensors from Conv layers can be down-sampled by the pooling layers, reducing time resolution while retaining the most important information. The fully connected layers combine outputs from the previous layers and decide the final predictions. The output of the convolution layer l-1 in 1D CNN is expressed in Equation 5, where k means the k th neuron, and b and ω are biases and filter weights at layer l-1. The output is sent to non-linear activation function and then down-sampled in the pooling layer l, as shown in Equation 6.

$$x_k^l = b_k^l + \sum_{i=1}^{N_{l-1}} conv1D\left(w_{ik}^{l-1}, s_i^{l-1}\right) \qquad \text{(Eq. 5)}$$

$$x_k^l = f\left(x_k^l\right) \text{ and } s_k^l = x_k^l \downarrow ss \qquad \text{(Eq. 6)}$$

Data Processing and Fusion

Figure 9:
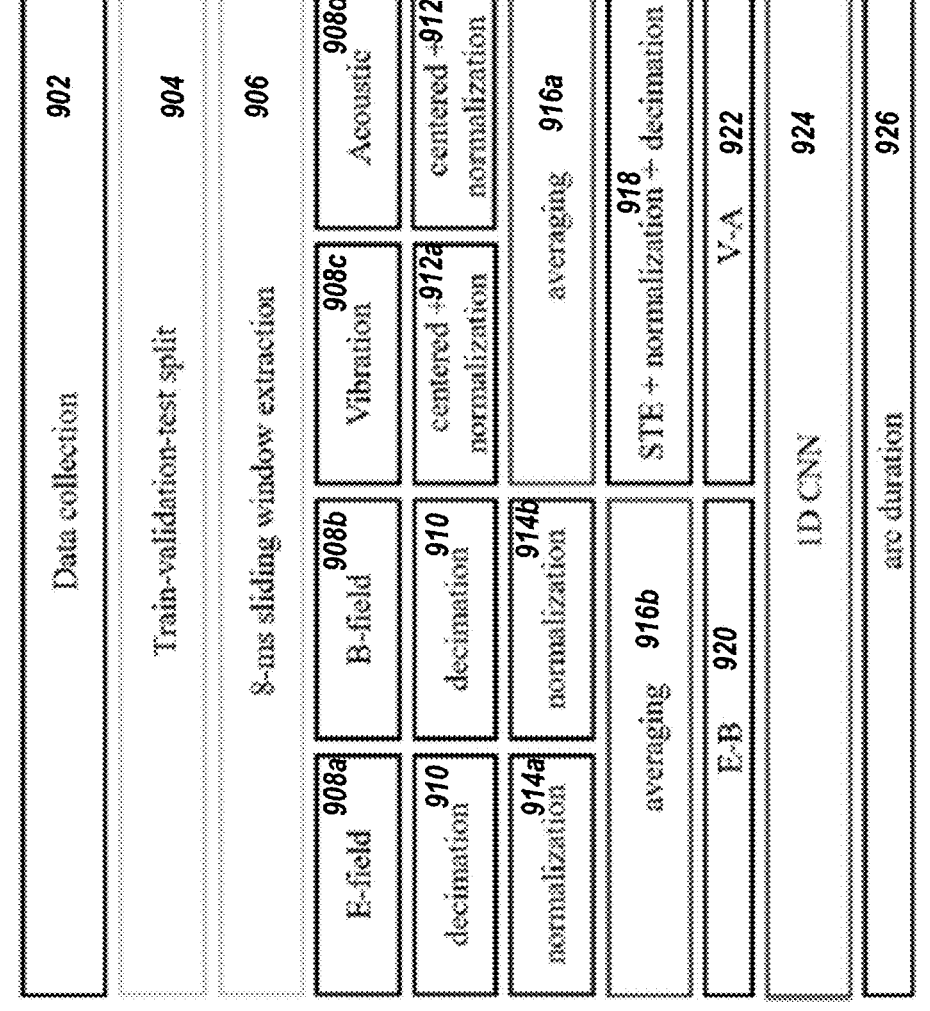
FIG. 9 shows an example method of arc duration measurement, according to an illustrative embodiment of the present disclosure.

FIG. 9 illustrates an example method 900 of generating an estimated arc duration according to embodiments of the present disclosure.

At step 902, load-switching experiments can be performed. Load-switching experiments are conducted with fixed sensor locations and current-peak amplitude. In the study, as the alternating current was quenched at the next current-zero point, all arc durations were less than half a cycle. Eighty-nine (89) measurements were captured to guarantee that the arcing time of the data set covers the range between 0 and 7 ms. FIG. 6 shows arc durations of the raw dataset. To enhance relevant features, and reduce the impact of noise and delay, the raw data can be processed using the signal processing and/or fusion steps described herein.

At step 904, a train-validation-test split can be performed. The datasets can undergo a random partitioning into three groups for training, validation, and testing, with optionally 80%, 10%, and 10% of the data allocated to each set. It should be understood that the amount of data and the proportion of data used for training, validation, and testing can be different in different embodiments of the present disclosure.

To process the E-field signal 908a and B-field signal 908b, decimation steps 910a 910b can be employed to reduce the input size and simplify the model while suppressing the noise of higher frequency. A decimation factor of 10 was selected to preserve the original patterns, but it should be understood that 10 is a non-limiting example and that other factors can be used. Both E-field signal 908a and B-field signal 908b can be normalized at steps 914a and 914b and then fused by taking their average at averaging step 916b. The normalization can ensure that the fused E-field and B-field (E-B) data to the 1D CNN are bounded between 0 and 1. Signal averaging further increases the signal-to-noise ratio, which can make the data more amenable to deep learning algorithms.

To process the vibration signals 908c and acoustic signals 908d, they can be centered and normalized at steps 912a and 912b and fused by signal averaging at step 916a. The resultant data exhibited a similar pattern: a significant increase in amplitude after the contact separation. To further enhance the boundary between the signals prior to and post-switching, short-time energy (STE) is calculated. [37]-[40]. The equation for STE calculation is shown in Equation 7A, where x(t) is the original time series and ω(n) is the moving window function. A rectangle window function was utilized in this study, as illustrated in Equation 7B. The application of STE also facilitates the removal of white noise, as the accumulated energy of white noise is usually constant. Normalization and decimation can optionally also be applied on the fused vibration-acoustic (V-A) data (e.g., at step 918). FIG. 7 shows the E-B data and V-A data (where the original data are shown in FIG. 5) obtained based on the above example fusion algorithm.

$$STE(n) = \sum_{t=-\infty}^{\infty} x^2(t)\omega(n-t) \qquad \text{(Eq. 7)}$$

$$\omega(n) = \begin{cases} 1, & |n| \le 0.5 \text{ ms} \\ 0, & |n| > 0.5 \text{ ms} \end{cases} \qquad \text{(Eq. 8)}$$

Data augmentation is a technique for improving the performance of neural networks. To overcome the issue of data waste during the decimation stage, where nine out of every ten data points can be discarded, the present disclosure includes improvements to the decimation approach, as described herein. In the example embodiment, the same time series is sub-sampled five times simultaneously, where for the first (or i-th) sub-sampling, the second (or 2i-th) point of every ten points is selected, resulting in a five-fold increase in data volume. Moreover, data augmentation was achieved through sliding window extraction at step 906. As illustrated in FIG. 5, an 8-ms window slides through the entire time with a step of 0.1 ms to extract different time frames, and only frames covering both the contact separation time and the current interruption time are included in the dataset, leading to a twenty-fold increase in data volume. Optionally, the two augmentation methods generate similar data. However, the training, validation, and testing sets can be optionally split before data augmentation to ensure that the test and validation data are entirely new and distinct from the training data. The example resulting dataset included at least 9000 samples for the training set, 1000 samples for the validation set, and 1000 samples for the testing set.

To fuse the E-B and V-A data, a multi-input 1D CNN architecture was employed. As shown in FIG. 8, the 8-ms E-B data 920 and V-A data 922, which can be extracted by sliding window, are fed into the first convolutional layer of the 1D CNN 924. The Conv layers can recognize waveform patterns and shapes. In the case of E-B data 920 and V-A data 922, two waveform patterns of interest are the strongest spike in the E-B signal, which represents arc extinction, and the "onset" of the V-A signal, which represents contact separation. To ensure that the features of the two signals do not interfere with each other, the first Conv layer was split into two separate parts, each responsible for extracting features from one signal, as depicted in FIG. 8. Given the complexity of the E-B signal, 8 filters were used for EB feature extraction, while 4 filters were used for V-A signals. The example filters have a length of 100, equivalent to one millisecond, to fully cover the spiking in E-B data. The Max pooling (MaxP) is used in this model to down-sample the data. MaxP works by dividing the input data into a set of non-overlapping rectangular regions, and then taking the maximum value of each region. It should be understood that the number and type of filters, filter lengths, and timescales used herein are intended only as non-limiting examples.

The features extracted by the first Conv layer were concatenated into one tensor and passed to the second Conv layer. In this layer, the convolution may optionally not be performed separately, but instead, all filters are applied to the concatenated data. This can be where the multi-input 1D CNN architecture merges. Finally, the output tensor of the second layer is flattened into a 1D vector and passed through the fully connected layers to compute the arc duration 926 that can optionally be output and/or used to perform other estimates of system durability and/or lifespan.

Deployed Arc Duration Measurement Scheme

In the example shown in FIG. 9, data fusion includes averaging and the 1D CNN described herein. Optionally, embodiments of the present disclosure trained for use on real-world arcs can slice measurements into frames (e.g., 8 ms frames), which can be adjusted based on the system frequency and then fed into the measurement algorithm. As described herein, a proper overlap between each frame ensures that at least one frame covers both the contact separation time and the current interruption time. In some embodiments deployed on real-world implementations, arcs may be deployed and/or trained without performing a train-validation-test split and/or data augmentation and/or deci-mation and/or sliding window extraction.

Case Study

Evaluation of Test Set

To evaluate the performance of the example systems and methods disclosed herein, the root mean squared error (RMSE), as shown in Equation 8, has been utilized as the metric. The accuracy of the CNN model depends on the training method and training data. So, in this paper, the 1D CNN model has been trained using stochastic gradient descent and Adam optimizer based on five different train-validation-test splits. The use of different splits ensures that evaluation results are reliable and statistically sound, as it helps mitigate the impact of random variations in the data on the model's performance. The RMSE of the example method training on different splits is shown in TABLE. I.

$$RMSE = \sqrt{\frac{1}{N} \sum_{I=1}^{N} (y_{true} - y_{calculated})^2} \qquad \text{(Eq. 8)}$$

TABLE I

| RMSE OF THE EXAMPLE METHOD ON CLEAN DATA | | | | |
|---|---|---|---|---|
| No. | 1 | 2 | 3 | 4 | 5 |
| RMSE | 0.097 | 0.103 | 0.214 | 0.142 | 0.263 |

Upon further analysis, it has been observed that the average RMSE is 0.1638 ms, which is significantly lower than the half cycle of a 60 Hz system. The average arc duration of the dataset is 3.65 ms, and hence, the percentage error is less than 5%. This indicates that the example method has a millisecond level of accuracy for arc duration mea-surements.

Noise Interference

Figure 10:
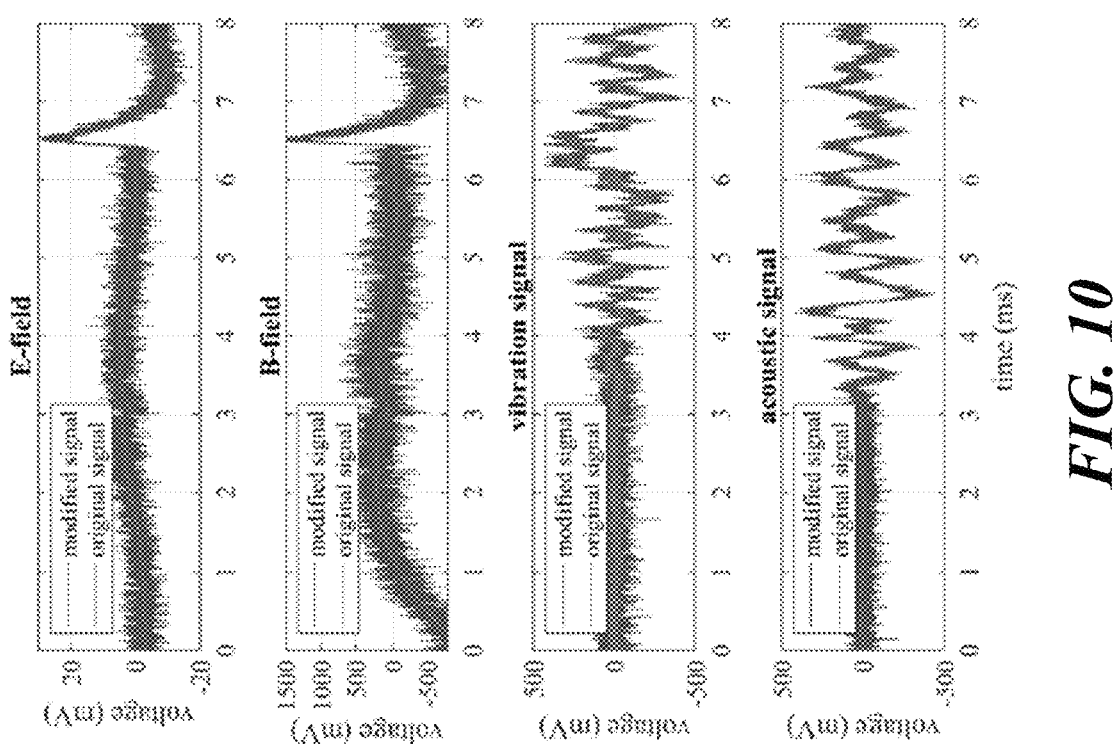
FIG. 10 shows example Gaussian noise-injected raw measurements from a study of an illustrative embodiment of the present disclosure.

To further assess the robustness of the example method to the noise interference, a series of tests are conducted on 20 randomly selected data sets, where Gaussian noise and spiking noise are introduced into these raw measurements. As illustrated in FIG. 10, Gaussian noise (with a mean of 0 and standard deviation equal to the mean of the absolute value of the data) is injected into each measurement. The modified signals are shown in blue, while the original signals are in orange. Notably, the noise has significantly obscured the particular waveform at the contact separation time in both the E-field and B-field data and reduced the signal-to-noise ratio considerably.

The modified signals are then subjected to the same signal processing and fusion steps as the original data, with the exception of the train-validation-test split, as all data are used to test the model. TABLE. II presents the RMSE of the example method when testing the noise-injected data, with an average RMSE of 0.714 ms. The results suggest that although the RMSE of all models has increased by a factor of 4.36, the maximum RMSE remains around 1 ms, thereby indicating the algorithm's robustness against Gaussian noise.

TABLE II

| RMSE OF THE EXAMPLE METHOD ON NOISE-INJECTED DATA (GAUSSIAN) | | | | |
| --- | --- | --- | --- | --- |
| No. | 1 | 2 | 3 | 4 | 5 |
| RMSE | 0.948 | 0.422 | 0.657 | 1.130 | 0.413 |

There are two primary factors that enable the example method to perform well on signals contaminated with Gaussian noise. Firstly, while the noise tends to obscure most of the features, it retains the fundamental trend of the strongest spiking signals in the E-field and B-field, which CNN can still identify. Secondly, the use of the Short-Time Energy (STE) feature extraction technique serves to minimize the impact of Gaussian noise on the signal. Specifically, since the STE of different segments of Gaussian noise should be uniform or very similar, adding Gaussian noise to raw measurements merely contributes a constant offset to the STE signal, leaving the shape of the VA signal unaffected. Additional factors include using decimation and signal averaging which can also reduce the impact of noise.

Figure 11:
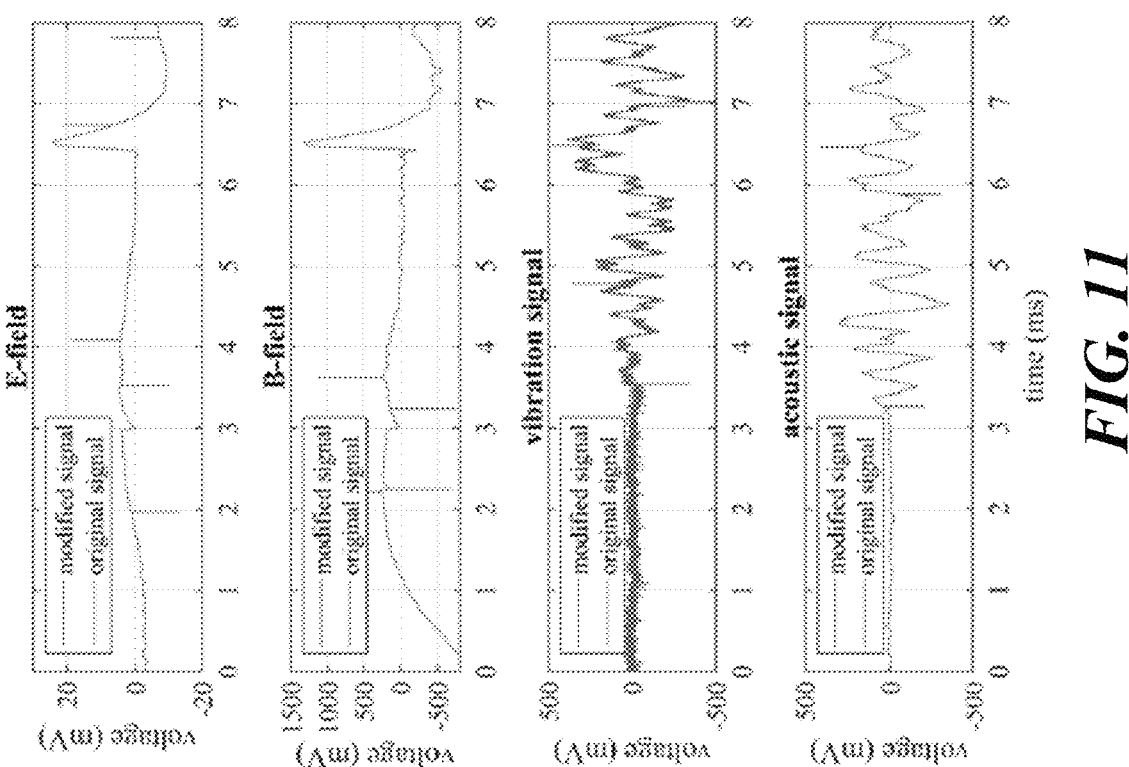
FIG. 11 shows example spiking noise-injected raw measurements from a study of an illustrative embodiment of the present disclosure.

In FIG. 11, spike noise (with an amplitude of 5 times the mean absolute value of the data and a probability of 0.1%) is added to each measurement. Given that the sampling frequency of the measurements is 1 MHz, the probability of 0.1% corresponds to an average of one spiking noise per millisecond. The modified data are then fed into the trained models, and the resulting RMSE is summarized in TABLE. III, below. It is observed that the mean RMSE only slightly increases to 0.2367. This is because adding spiking noise does not significantly alter the waveform shapes, and the signal averaging and STE processes can further weaken these spiking signals, thereby reducing their impact on the results.

TABLE III

| RMSE OF THE EXAMPLE METHOD ON NOISE-INJECTED DATA (SPIKING) | | | | |
| --- | --- | --- | --- | --- |
| No. | 1 | 2 | 3 | 4 | 5 |
| RMSE | 0.2296 | 0.1990 | 0.2606 | 0.2243 | 0.2702 |

Sensor Failure

Sensor failure is a common issue in many measurement systems, and it can significantly impact the accuracy and reliability of the measurements. To evaluate the robustness of the example method to sensor failure, the study included 20 sets of randomly selected data. Sensor failure was simulated by randomly replacing one measurement of one set of data with zeros. The results, summarized in TABLE. IV, show that the RMSE (0.5726) is lower than that observed in Gaussian noise-injected data but higher than that observed in spiking noise-injected data. Despite this, the average RMSE remained less than 1 ms, indicating that the performance of the method is minimally affected by probe failure. This robustness is attributed to the signal averaging steps in the fusion algorithm, which ensure that the shape of the E-B and V-A signals is preserved, even in the presence of missing measurements.

TABLE IV

| RMSE OF THE EXAMPLE METHOD ON SENSOR FAILURE DATA | | | | |
| --- | --- | --- | --- | --- |
| No. | 1 | 2 | 3 | 4 | 5 |
| RMSE | 0.604 | 0.546 | 0.570 | 0.528 | 0.615 |

Discussion

This study validates an example embodiment of the present disclosure including a sensor fusion-based approach for accurately measuring arc duration in vacuum circuit breakers. The example method used a combination of VLF and LF E-field and B-field, vibration, and acoustic signals as input data. The example embodiment leveraged various signal processing and data fusion techniques, including decimation, signal averaging, STE, and 1D CNN, and produced a good performance in detecting and estimating the arc duration, even in the presence of severe noise interference and sensor failure.

The example sensor fusion algorithm studied is capable of accurately determining the arc duration while exhibiting the ability to withstand noise interferences and sensor failures. Notably, the 1D CNN utilized in this method is trained solely on clean data, suggesting that incorporating modified data during training can further improve robustness against noise and sensor failure. These results demonstrate the improvements of the example embodiment of the present disclosure over previous systems and methods.

It should be understood that embodiments of the present disclosure can include additional features not present in the example embodiment studied. For example, additional training data can be used in embodiments of the present disclosure, and training data can optionally be based on different substation environments and/or specific substation environments. Alternatively, or additionally, embodiments of the present disclosure can be configured for use in situations with mutual interference (e.g., between multiple circuit breakers), to improve the performance of embodiments of the present disclosure in environments with multiple circuit breakers (or other arc sources) (e.g., substations).

Example Computing Device

The methods described herein can be implemented using a computing device. It should be understood that the example computing device described herein is only one example of a suitable computing environment upon which the methods described herein may be implemented. Optionally, the computing device can be a computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In a configuration, a computing device includes at least one processing unit and system memory. Depending on the configuration and type of computing device, system memory may be volatile (such as random-access memory (RAM), non-volatile (such as read-only memory (ROM), flash memory, etc.), or some combination of the two. The processing unit may be a standard programmable processor that performs arithmetic and logic operations necessary for the operation of the computing device. The computing device may also include a communication bus or other communication mechanism for communicating information among various components of the computing device.

Computing device may have additional features/functionality. For example, computing device may include additional storage such as removable storage and non-removable storage, including, but not limited to, magnetic or optical disks or tapes. Computing device may also contain network connection(s) that allow the device to communicate with other devices. Computing device may also have input and output means such as a keyboard, mouse, touch screen, a display, speakers, printer, etc. The additional devices may be connected to the communication bus in order to facilitate the communication of data among the components of the computing device. All these devices are known in the art and need not be discussed at length here.

The processing unit may be configured to execute program code encoded in tangible, computer-readable media. Tangible, computer-readable media refers to any media that is capable of providing data that causes the computing device (i.e., a machine) to operate in a particular fashion. Various computer-readable media may be utilized to provide instructions to the processing unit for execution. Examples of tangible, computer-readable media may include, but is not limited to, volatile media, non-volatile media, removable media, and non-removable media implemented in any method or technology for storage of information such as computer-readable instructions, data structures, program modules, or other data. System memory, removable storage, and non-removable storage are all examples of tangible, computer storage media. Examples of tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example embodiment, the processing unit may execute program code stored in the system memory. For example, the communication bus may carry data to the system memory, from which the processing unit receives and executes instructions. The data received by the system memory may optionally be stored on the removable storage or the non-removable storage before or after execution by the processing unit.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high-level procedural or object-oriented programming language to communicate with a computer system. However, the program(s) can be implemented in assembly or machine language, if desired. In any case, the language may be a compiled or interpreted language, and it may be combined with hardware implementations.

It should be appreciated that the logical operations described above and, in the appendix, can be implemented (1) as a sequence of computer-implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as state operations, acts, or modules. These operations, acts and/or modules can be implemented in software, in firmware, in special purpose digital logic, in hardware, and any combination thereof. It should also be appreciated that more or fewer operations can be performed than shown in the figures and described herein. These operations can also be performed in a different order than those described herein.

Machine Learning. In addition to the machine learning features described above, the system can be implemented using one or more artificial intelligence and machine learning operations. The term "artificial intelligence" can include any technique that enables one or more computing devices or computing systems (i.e., a machine) to mimic human intelligence. Artificial intelligence (AI) includes but is not limited to knowledge bases, machine learning, representation learning, and deep learning. The term "machine learning" is defined herein to be a subset of AI that enables a machine to acquire knowledge by extracting patterns from raw data. Machine learning techniques include, but are not limited to, logistic regression, support vector machines (SVMs), decision trees, Naïve Bayes classifiers, and artificial neural networks. The term "representation learning" is defined herein to be a subset of machine learning that enables a machine to automatically discover representations needed for feature detection, prediction, or classification from raw data. Representation learning techniques include, but are not limited to, autoencoders and embeddings. The term "deep learning" is defined herein to be a subset of machine learning that enables a machine to automatically discover representations needed for feature detection, prediction, classification, etc., using layers of processing. Deep learning techniques include but are not limited to artificial neural networks or multilayer perceptron (MLP).

Machine learning models include supervised, semi-supervised, and unsupervised learning models. In a supervised learning model, the model learns a function that maps an input (also known as feature or features) to an output (also known as target) during training with a labeled data set (or dataset). In an unsupervised learning model, the algorithm discovers patterns among data. In a semi-supervised model, the model learns a function that maps an input (also known as a feature or features) to an output (also known as a target) during training with both labeled and unlabeled data.

Neural Networks. An artificial neural network (ANN) is a computing system including a plurality of interconnected neurons (e.g., also referred to as "nodes"). This disclosure contemplates that the nodes can be implemented using a computing device (e.g., a processing unit and memory as described herein). The nodes can be arranged in a plurality of layers, such as an input layer, an output layer, and optionally one or more hidden layers with different activation functions. An ANN having hidden layers can be referred to as a deep neural network or multilayer perceptron (MLP). Each node is connected to one or more other nodes in the ANN. For example, each layer is made of a plurality of nodes, where each node is connected to all nodes in the previous layer. The nodes in a given layer are not interconnected with one another, i.e., the nodes in a given layer function independently of one another. As used herein, nodes in the input layer receive data from outside of the ANN, nodes in the hidden layer(s) modify the data between the input and output layers, and nodes in the output layer provide the results. Each node is configured to receive an input, implement an activation function (e.g., binary step, linear, sigmoid, tanh, or rectified linear unit (ReLU) function), and provide an output in accordance with the activation function. Additionally, each node is associated with a respective weight. ANNs are trained with a dataset to maximize or minimize an objective function. In some implementations, the objective function is a cost function, which is a measure of the ANN's performance (e.g., error such as L1 or L2 loss) during training, and the training algorithm tunes the node weights and/or bias to minimize the cost function. This disclosure contemplates that any algorithm that finds the maximum or minimum of the objective function can be used for training the ANN. Training algorithms for ANNs include but are not limited to backpropagation. It should be understood that an artificial neural network is provided only as an example machine learning model. This disclosure contemplates that the machine learning model can be any supervised learning model, semi-supervised learning model, or unsupervised learning model. Optionally, the machine learning model is a deep learning model. Machine learning models are known in the art and are therefore not described in further detail herein.

A convolutional neural network (CNN) is a type of deep neural network that has been applied, for example, to image analysis applications. Unlike traditional neural networks, each layer in a CNN has a plurality of nodes arranged in three dimensions (width, height, depth). CNNs can include different types of layers, e.g., convolutional, pooling, and fully-connected (also referred to herein as "dense") layers. A convolutional layer includes a set of filters and performs the bulk of the computations. A pooling layer is optionally inserted between convolutional layers to reduce the computational power and/or control overfitting (e.g., by downsampling). A fully-connected layer includes neurons, where each neuron is connected to all of the neurons in the previous layer. The layers are stacked similarly to traditional neural networks. GCNNs are CNNs that have been adapted to work on structured datasets such as graphs.

Other Supervised Learning Models. A logistic regression (LR) classifier is a supervised classification model that uses the logistic function to predict the probability of a target, which can be used for classification. LR classifiers are trained with a data set (also referred to herein as a "dataset") to maximize or minimize an objective function, for example, a measure of the LR classifier's performance (e.g., an error such as L1 or L2 loss), during training. This disclosure contemplates that any algorithm that finds the minimum of the cost function can be used. LR classifiers are known in the art and are therefore not described in further detail herein.

A Naïve Bayes' (NB) classifier is a supervised classification model that is based on Bayes' Theorem, which assumes independence among features (i.e., the presence of one feature in a class is unrelated to the presence of any other features). NB classifiers are trained with a data set by computing the conditional probability distribution of each feature given a label and applying Bayes' Theorem to compute the conditional probability distribution of a label given an observation. NB classifiers are known in the art and are therefore not described in further detail herein.

A k-NN classifier is an unsupervised classification model that classifies new data points based on similarity measures (e.g., distance functions). The k-NN classifiers are trained with a data set (also referred to herein as a "dataset") to maximize or minimize a measure of the k-NN classifier's performance during training. This disclosure contemplates any algorithm that finds the maximum or minimum. The k-NN classifiers are known in the art and are therefore not described in further detail herein.

A majority voting ensemble is a meta-classifier that combines a plurality of machine learning classifiers for classification via majority voting. In other words, the majority voting ensemble's final prediction (e.g., class label) is the one predicted most frequently by the member classification models. The majority voting ensembles are known in the art and are therefore not described in further detail herein.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "5 approximately" one particular value and/or to "about" or "approximately" another particular value. When such a range is expressed, other exemplary embodiments include from the one particular value and/or to the other particular value.

By "comprising" or "containing" or "including" is meant that at least the name compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest."

It should be appreciated that as discussed herein, a subject may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to human (e.g. rat, dog, pig, monkey), etc. It should be appreciated that the subject may be any applicable human patient, for example.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5).

Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

The following patents, applications and publications as listed below and throughout this document are hereby incorporated by reference in their entirety herein.

[1] P. G. Slade, The vacuum interrupter: theory, design, and application. CRC press, 2018.

[2] B. Feizifar and O. Usta, "Condition monitoring of circuit breakers: Current status and future trends," in 2017 IEEE International Conference on Environment and Electrical Engineering and 2017 IEEE Industrial and Commercial Power Systems Europe (EEEIC/I&CPS Europe), pp. 15, IEEE, 2017.

[3] A. A. Razi-Kazemi and K. Niayesh, "Condition monitoring of high voltage circuit breakers: past to future," IEEE Transactions on Power Delivery, vol. 36, no. 2, pp. 740-750, 2020.

[4] T. Cheng, W. Gao, W. Liu, and R. Li, "Evaluation method of contact erosion for high voltage sf6 circuit breakers using dynamic contact resistance measurement," Electric Power Systems Research, vol. 163, pp. 725-732, 2018

[5] M. Abdollah and A. A. Razi-Kazemi, "Intelligent failure diagnosis for gas circuit breakers based on dynamic resistance measurements," IEEE Transactions on Instrumentation and Measurement, vol. 68, no. 9, pp. 3066-3077, 2018.

[6] G. Chen, M. Li, Q. Wang, X. Lu, S. Zhang, and D. Luo, "The contact erosion characteristics of sf6 circuit breaker based on dynamic resistance measurement method," Energy Reports, vol. 8, pp. 1081-1089, 2022.

[7] H. F. dos Santos Sousa, A. Costa de Oliveira, G. V. Rocha Xavier, H. Nunes de Santana, E. G. da Costa, and T. Vilela Ferreira, "Analysis of alternative parameters of dynamic resistance measurement in high voltage circuit breakers," High Voltage, vol. 4, no. 3, pp. 197-202, 2019.

[8] M. Mohammadhosein, K. Niayesh, A. A. S. Akmal, and H. Mohseni, "Sensitivity of dynamic resistance of gas circuit breakers to the arcinduced contact erosion," in 2019 5th International Conference on Electric Power Equipment-Switching Technology (ICEPE-ST), pp. 3437, IEEE, 2019.

[9] T. Takagi and H. Inoue, "Distribution of arc duration and material wear due to arc for ag, cu, and pd contacts," IEEE Transactions on Components, Hybrids, and Manufacturing Technology, vol. 2, no. 1, pp. 20-24, 1979.

[10] H. Sone and T. Takagi, "Role of the metallic phase arc discharge on arc erosion in ag contacts," IEEE transactions on components, hybrids, and manufacturing technology, vol. 13, no. 1, pp. 13-19, 1990.

[11] J. Tepper, M. Seeger, T. Votteler, V. Behrens, and T. Honig, "Investigation on erosion of cu/w contacts in high-voltage circuit breakers," IEEE transactions on components and packaging technologies, vol. 29, no. 3, pp. 658-665, 2006.

[12] S. Zhu, Y. Liu, B. Tian, Y. Zhang, and K. Song, "Arc erosion behavior and mechanism of cu/cr20 electrical contact material," Vacuum, vol. 143, pp. 129-137, 2017.

[13] M. Mohammadhosein, K. Niayesh, A. A. Shayegani-Akmal, and H. Mohseni, "Online assessment of contact erosion in high voltage gas circuit breakers based on different physical quantities," IEEE Transactions on Power Delivery, vol. 34, no. 2, pp. 580-587, 2018.

[14] M. Takashima, N. Yamamura, M. Hasegawa, Y. Watanae, and K. Sawa, "Investigations on mass change and surface morphology of contacts in electromagnetic contactor," in the Forty-Ninth IEEE Holm Conference on Electrical Contacts., pp. 84-90, IEEE, 2003.

[15] K. Sawa, K. Yoshida, M. Watanabe, and K. Suzuki, "Arc characteristics and electrode mass change of agni contacts for electromagnetic contactors," in 2010 Proceedings of the 56th IEEE Holm Conference on Electrical Contacts, pp. 1-6, IEEE, 2010.

[16] A. Bagherpoor, S. Rahimi-Pordanjani, A. A. Razi-Kazemi, and K. Niayesh, "Online condition assessment of interruption chamber of gas circuit breakers using arc voltage measurement," IEEE Transactions on Power Delivery, vol. 32, no. 4, pp. 1776-1783, 2016.

[17] J. J. Shea, "Modeling contact erosion in three phase vacuum contactors," IEEE Transactions on Components, Packaging, and Manufacturing Technology: Part A, vol. 21, no. 4, pp. 556-564, 1998.

[18] M. A. K. Pramanik, T. Takagi, and K. Mano, "A new method for the measurement and integration of arc durations in electrical contacts," IEEE Transactions on Instrumentation and Measurement, vol. 24, no. 2, pp. 188-193, 1975.

[19] Z. Fu, W. Chen, Z. Li, L. Xiang, C. Li, K. Bian, L. Wang, and B. Liu, "Wear mechanism and mass loss characteristic of arcing contacts in sf6 circuit breaker in making process," IEEE Transactions on Components, Packaging and Manufacturing Technology, vol. 8, no. 9, pp. 1593-1603, 2018.

[20] M. A. Chapman, Possibilities and limitations of radio-frequency measurement of arc duration in HVAC circuit breakers. PhD thesis, ETH Zurich, 2011.

[21] T. Sidhu, G. Singh, and M. Sachdev, "Microprocessor based instrument for detecting and locating electric arcs," IEEE transactions on power delivery, vol. 13, no. 4, pp. 1079-1085, 1998.

[22] A. Ukil, M. Zlatanski, and M. Hochlehnert, "Monitoring of hv generator circuit breaker contact ablation based on acoustic emission," IEEE Transactions on Instrumentation and Measurement, vol. 62, no. 10, pp. 2683-2693, 2013.

[23] M. Chapman, "Radio-frequency-based determination of arcing duration in hvac circuit breakers," in CIRED 2005-18th International Conference and Exhibition on Electricity Distribution, pp. 1-5, IET, 2005.

[24] M. Mohammadhosein, K. Niayesh, A. A. Shayegani Akmal, and H. Mohseni, "Online non-invasive evaluation of arcing time for condition assessment of high-voltage gas circuit breakers," IET Generation, Transmission & Distribution, vol. 15, no. 6, pp. 1013-1020, 2021.

[25] J. Fayyad, M. A. Jaradat, D. Gruyer, and H. Najjaran, "Deep learning sensor fusion for autonomous vehicle perception and localization: A review," Sensors, vol. 20, no. 15, p. 4220, 2020.

[26] J. Zhang, Y. Wu, Z. Xu, Z. Din, and H. Chen, "Fault diagnosis of high voltage circuit breaker based on multi-sensor information fusion with training weights," Measurement, vol. 192, p. 110894, 2022.

[27] S. Qiu, H. Zhao, N. Jiang, Z. Wang, L. Liu, Y. An, H. Zhao, X. Miao, R. Liu, and G. Fortino, "Multi-sensor information fusion based on machine learning for real applications in human activity recognition: State-of-the-art and research challenges," Information Fusion, vol. 80, pp. 241-265, 2022.

[28] M. B. Cohen, R. K. Said, E. W. Paschal, J. C. McCormick, N. C. Gross, L. Thompson, M. Higginson-Rollins, U. S. Inan, and J. Chang, "Broadband longwave radio remote sensing instrumentation," Review of Scientific Instruments, vol. 89, no. 9, p. 094501, 2018.

[29] B. V. Gurses, K. T. Whitmore, and M. B. Cohen, "Ultra-sensitive broadband "awesome" electric field receiver for nanovolt low-frequency signals," Review of Scientific Instruments, vol. 92, no. 2, p. 024704, 2021.

[30] Q. Yang, J. Ruan, Z. Zhuang, and D. Huang, "Condition evaluation for opening damper of spring operated high-voltage circuit breaker using vibration time-frequency image," IEEE Sensors Journal, vol. 19, no. 18, pp. 8116-8126, 2019.

[31] Q. Yang, J. Ruan, and Z. Zhuang, "Fault diagnosis of circuit breakers based on time-frequency and chaotic vibration analysis," IET Generation, Transmission & Distribution, vol. 14, no. 7, pp. 1214-1221, 2020.

[32] A. Korzhov, I. Okrainskaya, A. Sidorov, and V. Kufel'd, "A study of electromagnetic radiation of corona discharge near 500-ky electric installations," Power Technology and Engineering, vol. 38, pp. 57-60, 2004.

[33] S. Kiranyaz, T. Ince, R. Hamila, and M. Gabbouj, "Convolutional neural networks for patient-specific ecg classification," in 2015 37th Annual International Conference of the IEEE Engineering in Medicine and Biology Society (EMBC), pp. 2608-2611, IEEE, 2015.

[34] O. Abdeljaber, O. Avci, S. Kiranyaz, M. Gabbouj, and D. J. Inman, "Realtime vibration-based structural damage detection using one-dimensional convolutional neural networks," Journal of Sound and Vibration, vol. 388, pp. 154-170, 2017.

[35] L. Eren, T. Ince, and S. Kiranyaz, "A generic intelligent bearing fault diagnosis system using compact adaptive 1" "dcnn classifier," Journal of Signal Processing Systems, vol. 91, pp. 179-189, 2019.

[36] X. Wang, D. Mao, and X. Li, "Bearing fault diagnosis based on vibroacoustic data fusion and id-cnn network," Measurement, vol. 173, p. 108518, 2021.

[37] M. Jalil, F. A. Butt, and A. Malik, "Short-time energy, magnitude, zero crossing rate and autocorrelation measurement for discriminating voiced and unvoiced segments of speech signals," in 2013 The international conference on technological advances in electrical, electronics and computer engineering (TAEECE), pp. 208-212, IEEE, 2013.

[38] R. W. Schafer and L. R. Rabiner, "Digital representations of speech signals," Proceedings of the IEEE, vol. 63, no. 4, pp. 662-677, 1975.

[39] Y. Meng, S. Jia, Z. Shi, and M. Rong, "The detection of the closing moments of a vacuum circuit breaker by vibration analysis," IEEE transactions on power delivery, vol. 21, no. 2, pp. 652-658, 2006.

[40] C.-C. Hsu, G. Frusque, M. Muratovic, C. M. Franck, and O. Fink, "Vacuum circuit breaker closing time key moments detection via vibration monitoring: A run-to-failure study," in 2022 IEEE International Conference on Systems, Man, and Cybernetics (SMC), pp. 254-260, IEEE, 2022.

What is claimed:

1. A method of determining arc duration in a circuit breaker, the method comprising:

receiving (i) a first measurement corresponding to a low-frequency electric field emitted from the circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired;

aligning the first measurement and the second measurement in time, wherein the first measurement is calibrated according to a first physical constant and wherein the second measurement is calibrated according to a second physical constant; and determining, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero), wherein the estimated duration value of the arc duration is employed, or accumulated with other estimated durations, to determine a contact erosion analysis, life analysis, or remaining life analysis of the circuit breaker.

2. The method of claim 1, wherein the first measurement comprises a low-frequency electric field signal, and wherein the second measurement comprises a low-frequency magnetic field signal.

3. The method of claim 1, wherein the first measurement comprises a low-frequency electric field signal, and wherein the second measurement comprises a low-frequency vibration signal.

4. The method of claim 1, wherein the first measurement comprises a low-frequency electric field signal, and wherein the second measurement comprises an acoustic signal.

5. The method of claim 1, wherein the trained AI model comprises a 1D CNN model (e.g., multi-input 1D CNN model).

6. The method of claim 1, wherein the first measurement is acquired via a dipole antenna positioned a distance from the circuit breaker.

7. The method of claim 1, wherein the second measurement is acquired via a magnetic field coil antenna, a microphone, an accelerometer, or a combination thereof.

8. The method of claim 1, wherein the second measurement is acquired by a microphone, and the microphone is insulated on a shock mount to decouple seismic (vibration) waves from sound waves associated with the interruption or circuit break operation.

9. The method of claim 1, wherein the circuit breaker is employed for distribution load switching, fault protection, or capacitor bank insertion and disconnection.

10. The method of claim 1, wherein the estimated duration value is employed in a subsequent arc energy/duration-based contact erosion analysis.

11. A system comprising:
a processor; and
a memory having instructions stored thereon, wherein execution of the instructions by the processor causes the processor to:
receive (i) a first measurement corresponding to a low-frequency electric field emitted from circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired;
align the first measurement and the second measurement in time, wherein the first measurement is calibrated according to a first physical constant and wherein the second measurement is calibrated according to a second physical constant; and
determine, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero),
wherein the estimated duration value of the arc duration is employed, or accumulated with other estimated durations, to determine a contact erosion analysis, life analysis, or remaining life analysis of the circuit breaker.

12. The system of claim 11, wherein the first measurement comprises a low-frequency electric field signal, and wherein the second measurement comprises a low-frequency magnetic field signal.

13. The system of claim 11, wherein the first measurement comprises a low-frequency electric field signal, and wherein the second measurement comprises a low-frequency vibration signal.

14. The system of claim 11, wherein the first measurement comprises a low-frequency electric field signal, and wherein the second measurement comprises a low-frequency acoustic signal.

15. The system of claim 11, wherein the trained AI model comprises a 1D CNN model (e.g., multi-input 1D CNN model).

16. The system of claim 11, wherein the first measurement is acquired via a dipole antenna positioned a distance from the circuit breaker.

17. The system of claim 11, wherein the second measurement is acquired via a magnetic field coil antenna, a microphone, an accelerometer, or a combination thereof.

18. The system of claim 11, wherein the second measurement is acquired by a microphone, and the microphone is insulated on a shock mount to decouple seismic (vibration) waves from sound waves associated with the interruption or circuit break operation.

19. The method of claim 1, wherein the estimated duration value is employed in a subsequent arc energy/duration-based contact erosion analysis.

20. A non-transitory computer-readable medium having instructions stored thereon, wherein execution of the instructions by a processor causes the processor to:
receive (i) a first measurement corresponding to a low-frequency electric field emitted from a circuit breaker during an interruption or circuit break operation and (ii) a second measurement corresponding to the low-frequency magnetic field, vibration, or acoustic emitted by the circuit breaker during operation, wherein the first measurement is acquired by an electric-field sensor, wherein the second measurement is acquired by a magnetic-field or acoustic sensor, wherein the first measurement and the second measurement are contemporaneously acquired;
align the first measurement and the second measurement in time, wherein the first measurement is calibrated according to a first physical constant and wherein the second measurement is calibrated according to a second physical constant; and
determine, by a sensor-fusion algorithm or a trained AI model, an estimated duration value of an arc duration occurring at the circuit breaker using the time-aligned first measurement and second measurement, wherein the arc duration corresponds to a first time corresponding to a separation of contacts (i.e., arc initiation) of the circuit breaker and a second time corresponding to arc extinction (e.g., when current is zero),
wherein the estimated duration value of the arc duration is employed, or accumulated with other estimated durations, to determine a contact erosion analysis, life analysis, or remaining life analysis of the circuit breaker.

* * * * *